(12) United States Patent
Takeshima et al.

(10) Patent No.: US 11,016,154 B2
(45) Date of Patent: May 25, 2021

(54) MAGNETIC RESONANCE IMAGING APPARATUS AND IMAGE RECONSTRUCTION PROGRAM

(71) Applicant: Toshiba Medical Systems Corporation, Otawara (JP)

(72) Inventors: Hidenori Takeshima, Ebina (JP); Kanako Saito, Kawasaki (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 701 days.

(21) Appl. No.: 15/222,407

(22) Filed: Jul. 28, 2016

(65) Prior Publication Data

US 2017/0045598 A1 Feb. 16, 2017

(30) Foreign Application Priority Data

Aug. 10, 2015 (JP) .............................. JP2015-158383

(51) Int. Cl.
*G01R 33/48* (2006.01)
*G01R 33/56* (2006.01)
*G01R 33/385* (2006.01)
*G01R 33/561* (2006.01)

(52) U.S. Cl.
CPC ....... *G01R 33/4818* (2013.01); *G01R 33/385* (2013.01); *G01R 33/5608* (2013.01); *G01R 33/5611* (2013.01)

(58) Field of Classification Search
CPC combination set(s) only.
See application file for complete search history.

(56) References Cited

U.S. PATENT DOCUMENTS

| 10,048,334 | B2 * | 8/2018 | Paul ...................... G01R 33/38 |
| 2003/0160612 | A1 * | 8/2003 | Yablonskiy ...... G01R 33/56341 324/309 |
| 2004/0102695 | A1 * | 5/2004 | Stergiopoulos .... G01R 33/5673 600/413 |
| 2005/0171424 | A1 * | 8/2005 | Brechbiel .......... A61K 49/0002 600/420 |

(Continued)

FOREIGN PATENT DOCUMENTS

| JP | 2009-160378 A | 7/2009 |
| JP | 2009-279202 A | 12/2009 |

(Continued)

OTHER PUBLICATIONS

Dan Xu Title: Improving k-t SENSE by Adaptive Regularization (Year: 2007).*

(Continued)

*Primary Examiner* — Alvaro E Fortich
(74) *Attorney, Agent, or Firm* — Oblon, McClelland, Maier & Neustadt, L.L.P.

(57) ABSTRACT

A magnetic resonance imaging apparatus according to an embodiment includes a processor. The processor acquires a plurality of pieces of k-space data with undersampling in at least one of axes of k-space and in a certain axis different from the axes of k-space. The processor rearranges the pieces of k-space data into a second order different from a first order in which the pieces of k-space data are acquired. The processor performs a reconstruction process on a rearranged k-space data group to generate an image group.

19 Claims, 15 Drawing Sheets

(56) References Cited

U.S. PATENT DOCUMENTS

| | | | |
|---|---|---|---|
| 2005/0270025 A1* | 12/2005 | Nozaki | G01R 33/56563 324/307 |
| 2006/0062486 A1* | 3/2006 | Lee | G01R 33/561 382/276 |
| 2007/0083105 A1* | 4/2007 | Miyazaki | G01R 33/5635 600/410 |
| 2007/0280520 A1* | 12/2007 | Takai | G01R 33/5616 382/131 |
| 2008/0252290 A1* | 10/2008 | Doyle | G01R 33/561 324/307 |
| 2008/0258723 A1* | 10/2008 | Abe | G01R 33/5613 324/307 |
| 2009/0278539 A1* | 11/2009 | Beatty | A61B 5/055 324/312 |
| 2011/0025325 A1* | 2/2011 | Li | G01R 33/4824 324/307 |
| 2012/0008833 A1* | 1/2012 | Song | G06T 7/0016 382/106 |
| 2014/0091796 A1* | 4/2014 | Grodzki | G01R 33/56572 324/309 |
| 2014/0160336 A1* | 6/2014 | Englund | G02B 27/58 348/332 |
| 2014/0300352 A1* | 10/2014 | Li | G01R 33/5608 324/309 |
| 2015/0028872 A1 | 1/2015 | Takeshima | |

FOREIGN PATENT DOCUMENTS

| | | |
|---|---|---|
| JP | 2011-143032 A | 7/2011 |
| JP | 2014-69007 | 4/2014 |

OTHER PUBLICATIONS

Jeffrey Tsao, Title: k-t BLAST and k-t SENSE: Dynamic MRI With High Frame Rate Exploiting Spatiotemporal Correlations (Year: 2003).*

Jeffrey Tsao et al. "k-t BLAST and k-t SENSE: Dynamic MRI With High Frame Rate Exploiting Spatiotemporal Correlations," Magnetic Resonance in Medicine, 2003, 12 Pages.

Dan Xu et al. "Improving k-t SENSE by adaptive Regularization," Magnetic Resonance in Medicine, 2007, 13 Pages.

M. Lustig et al. "k-t SPARSE: High frame rate dynamic MRI exploiting spatio-temporal sparsity," Proc. Intl. Soc. Mag. Reson. Med. 14, 2006, 1 Page.

Japanese Office Actian dated May 7, 2019 in Japanese Patent Appiication No. 2015-158383, 3 pages.

* cited by examiner

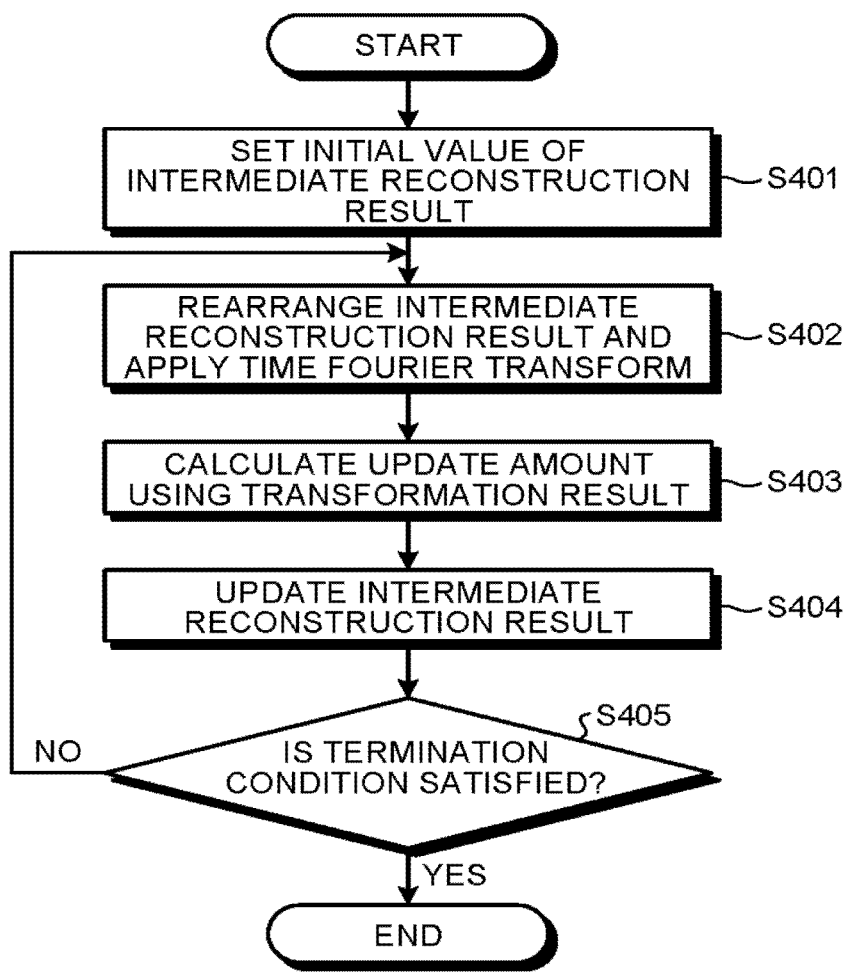

MAGNETIC RESONANCE IMAGING APPARATUS AND IMAGE RECONSTRUCTION PROGRAM

CROSS-REFERENCE TO RELATED APPLICATIONS

This application is based upon and claims the benefit of priority from Japanese Patent Application No. 2015-158383, filed on Aug. 10, 2015; the entire contents of which are incorporated herein by reference.

FIELD

Embodiments described herein relate generally to a magnetic resonance imaging apparatus and an image reconstruction program.

BACKGROUND

A magnetic resonance imaging apparatus (hereinafter referred to as MRI apparatus) is an apparatus that invasively visualizes the atom distribution inside a subject, using the property of atoms of hydrogen or others. The atoms placed in a magnetic field selectively absorb and emit an electromagnetic wave having a frequency specified by the kind of atoms and magnetic fields, among electromagnetic waves having various frequencies.

BRIEF DESCRIPTION OF THE DRAWINGS

FIG. 19 is a flowchart illustrating the procedure of processing performed by the MRI apparatus according to a second embodiment.

DETAILED DESCRIPTION

A magnetic resonance imaging apparatus according to embodiments includes a processor. The processor acquires a plurality of pieces of k-space data with undersampling in at least one of axes of k-space and in a certain axis different from the axes of k-space. The processor rearranges the pieces of k-space data into a second order different from a first order in which the pieces of k-space data are acquired. The processor performs a reconstruction process on the rearranged k-space data group to generate an image group.

A magnetic resonance imaging apparatus and an image reconstruction method according to embodiments will be described below.

First Embodiment

Figure 1:
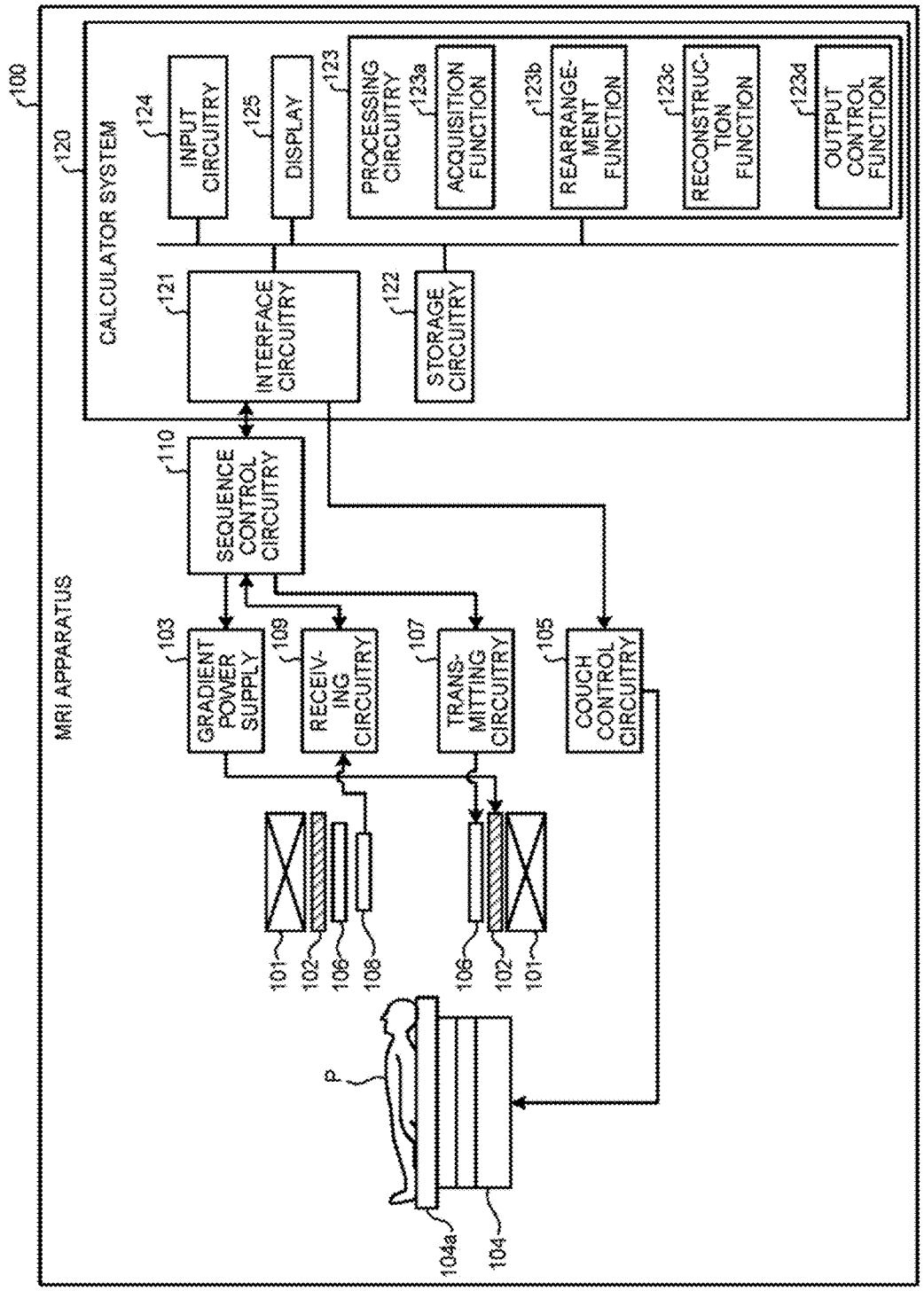
FIG. 1 is a block diagram illustrating an MRI apparatus according to a first embodiment.

FIG. 1 is a block diagram illustrating an MRI apparatus 100 according to a first embodiment. As illustrated in FIG. 1, the MRI apparatus 100 includes a static field magnet 101, a gradient coil 102, a gradient power supply 103, a couch 104, couch control circuitry 105, a transmitting coil 106, transmitting circuitry 107, a receiving coil array 109, receiving circuitry 109, sequence control circuitry 110, and a calculator system 120. The MRI apparatus 100 does not include a subject P (for example, human body).

The static field magnet 101 is a magnet having a hollow cylindrical shape (the shape including an oval cross section orthogonal to the axis of the cylinder) and generates a uniform static field in the internal space thereof. The static field magnet 101 is, for example, a permanent magnet or a superconducting magnet.

The gradient coil 102 is a coil having a hollow cylindrical shape (the shape including an oval cross section orthogonal to the axis of the cylinder) and is arranged on the inside of the static field magnet 101. The gradient coil 102 is formed by combining three coils corresponding to the X, Y, and z-axes orthogonal to each other. These three coils individually receive supply of current from the gradient power supply 103 and generate gradient magnetic fields with changing magnetic field intensities along the X, Y, and Z-axes. Here, the X, Y, Z-axis gradient magnetic fields generated by the gradient coil 102 correspond to, for example, a gradient magnetic field for slice selection Gs, a gradient magnetic field for phase encoding Ge, and a gradient magnetic field for read out Gr, respectively. The gradient magnetic field for slice selection Gs is used for specifying any given imaging cross section. The gradient magnetic field for phase encoding Ge is used for changing the phase of an MR signal in accordance with a spatial position. The gradient magnetic field for read out Gr is used for changing the frequency of an MR signal in accordance with a spatial position.

The gradient power supply 103 supplies current to the gradient coil 102. For example, the gradient power supply 103 supplies current individually to each of the three coils of the gradient coil 102.

The couch 104 includes a couchtop 104a on which a subject P lies. The couchtop 104a is inserted with a subject P lying thereon into the bore (imaging bore) of the gradient coil 102, under the control of the couch control circuitry 105. In general, the couch 104 is installed such that its longitudinal direction is parallel to the central axis of the static field magnet 101.

The couch control circuitry 105 is a processor that drives the couch 104 to move the couchtop 104a in the longitudinal direction and the up/down direction, under the control of the calculator system 120.

The transmitting coil 106 is arranged on the inside of the gradient coil 102 and receives supply of an RF pulse from the transmitting circuitry 107 to generate a high-frequency magnetic field.

The transmitting circuitry 107 supplies, to the transmitting coil 106, an RF pulse corresponding to a Larmor frequency specified by the kind of target atoms and the intensity of the magnetic field.

The receiving coil array 108 is arranged on the inside of the gradient coil 102 and receives a magnetic resonance signal (hereinafter referred to as MR signal) emitted from the subject P by the effect of the high-frequency magnetic field. Upon receiving an MR signal, the receiving coil array 109 outputs the received MR signal to the receiving circuitry 109. In the first embodiment, the receiving coil array 108 is a coil array having one or more, typically, a plurality of receiving coils.

The receiving circuitry 109 generates MR data based on the MR signal output from the receiving coil array 108. For example, the receiving circuitry 109 generates MR data by converting the MR signal output from the receiving coil array 108 into a digital format. The receiving circuitry 109 transmits the generated MR data to the sequence control circuitry 110.

The receiving circuitry 109 may be included in the gantry including the static field magnet 101, the gradient coil 102, and the like. In the first embodiment, MR signals output from the coil elements (the receiving coils) of the receiving coil array 108 are distributed or synthesized appropriately to be output in units called channels to the receiving circuitry 109. MR data is thus handled for each channel in the processing subsequent to the receiving circuitry 109. The total number of coil elements may be equal to the total number of channels, or the total number of channels may be smaller than the total number of coil elements, or conversely, the total number of channels may be greater than the total number of coil elements. The term "for each channel" referred to in the following may indicate that the processing may be performed for each coil element or may be performed for each of the channels formed by distribution and/or synthesis of the coil elements. The timing of distribution and/or synthesis is not limited to the timing described above. The MR signals or MR data are distributed and/or synthesized in units of channels before the reconstruction process described later.

The sequence control circuitry 110 drives the gradient power supply 103, the transmitting circuitry 107, and the receiving circuitry 109, based on sequence information transmitted from the calculator system 120, to image a subject P. For example, the sequence control circuitry 110 is implemented by a processor. The sequence information is information that defines the procedure for performing imaging. The sequence information defines, for example, the strength of power supply fed to the gradient coil 102 by the gradient power supply 103 and the timing of feeding power supply, the strength of an RF pulse transmitted to the transmitting coil 106 by the transmitting circuitry 107 and the timing of applying an RF pulse, and the timing at which the receiving circuitry 109 detects an MR signal.

As a result of driving the gradient power supply 103, the transmitting circuitry 107, and the receiving circuitry 109 to image the subject P, the sequence control circuitry 110 receives MR data from the receiving circuitry 109 and then transfers the received MR data to the calculator system 120.

The calculator system 120 performs, for example, central control of the MRI apparatus 100, data acquisition, and image reconstruction. The calculator system 120 includes interface circuitry 121, storage circuitry 122, processing circuitry 123, input circuitry 124, and a display 125.

The interface circuitry 121 transmits sequence information to the sequence control circuitry 110 and receives MR data from the sequence control circuitry 110. Upon receiving MR data, the interface circuitry 121 causes the received MR data to be stored in the storage circuitry 122. The MR data stored in the storage circuitry 122 is arranged in k-space by the processing circuitry 123. As a result, the storage circuitry 122 stores therein k-space data of a plurality of channels. k-space data is thus acquired. The interface circuitry 121 is implemented, for example, by a network interface card.

The storage circuitry 122 stores therein, for example, MR data received by the interface circuitry 121, time-series data (k-t space data) arranged in k-space by an acquisition function 123a described later, and image data generated by a reconstruction function 123c described later. The storage circuitry 122 also stores therein a variety of programs. The storage circuitry 122 is implemented by, for example, a semiconductor memory device such as a random access memory (RAM) or a flash memory, a hard disk, or an optical disk.

The input circuitry 124 accepts various instructions and information input from operators such as doctors and clinical radiologists. The input circuitry 124 is implemented by, for example, a track ball, a switch button, a mouse, and/or a keyboard. The input circuitry 124 is connected to the processing circuitry 123 and converts the input operation received from the operator into an electrical signal to output the signal to the processing circuitry 123.

The display 125 displays, for example, graphical user interfaces (GUIs) and magnetic resonance (MR) images generated by the reconstruction function 123c, under the control of the processing circuitry 123.

The processing circuitry 123 centrally controls the MRI apparatus 100. Specifically, the processing circuitry 123 controls imaging by generating sequence information based on the imaging conditions input from the operator through the input circuitry 124, and transmitting the generated sequence information to the sequence control circuitry 110. The processing circuitry 123 also controls reconstruction of an image performed based on MR data sent from the sequence control circuitry 110 as a result of imaging, and controls display on the display 125. The processing circuitry 123 is implemented by a processor. The processing circuitry 123 includes the acquisition function 123a, a rearrangement function 123b, the reconstruction function 123c, and an output control function 123d.

For example, the processing functions including the acquisition function 123a, the rearrangement function 123b, the reconstruction function 123c, and the output control function 123d, which are the components of the processing circuitry 123, are stored in the storage circuitry 122 in the form of computer-executable programs. The processing circuitry 123 reads each program from the storage circuitry 122 and executes the read program to implement the function corresponding to the program. In other words, the processing circuitry 123 in a state of reading each program has the corresponding function illustrated in the processing circuitry 123 in FIG. 1. In FIG. 1, a single processing circuitry 123 implements the processing functions including the acquisition function 123a, the rearrangement function 123b, the reconstruction function 123c, and the output control function 123d. However, a plurality of independent processors may be combined to configure the processing circuitry 123, and each processor may execute each program to implement the corresponding processing function.

As used in the foregoing description, the term "processor" means, for example, a central processing unit (CPU), a graphical processing unit (GPU), or circuitry such as an application specific integrated circuit (ASIC) and a programmable logic device (for example, a simple programmable logic device (SPLD), a complex programmable logic device (CPLD), and a field programmable gate array (FPGA)). A computer program may be directly built in a circuit in the processor, rather than being stored in the storage circuitry 122. In this case, the processor implements a function by reading and executing the program built in the circuit.

Here, the MRI apparatus measures an electromagnetic wave emitted from the subject with coils. The signal obtained by digitalizing the measured electromagnetic wave is called k-space data.

For example, k-space data is two-dimensional or three-dimensional data obtained by repeating one-dimensional imaging. The atom distribution image in the inside of the subject is obtained by subjecting k-space data to Fourier transform (hereinafter Fourier transform may include Fourier inverse transform). The obtained atom distribution image is called an MR image, and the process of calculating an MR image from k-space data is called, for example, reconstruction or image reconstruction, or image generation. The central part of k-space data corresponds to low-frequency components when an MR image is subjected to Fourier transform, and the peripheral part of k-space data corresponds to high-frequency components when an MR image is subjected to Fourier transform.

In MRI apparatuses, k-space data necessary for reconstruction is obtained by repeating one-dimensional imaging. This imaging is known to often take time. It is also known that when the state of the subject changes with time, the image quality of the reconstructed MR image is degraded.

For these reasons, there is a strong demand for reducing time for capturing time-series data in which the state of the subject is changing and the data volume is large, for example, imaging of pulsation of the heart. In order to perform faster imaging, for example, parallel imaging techniques have been studied and developed, which use sensitivities different depending on coil arrangement to undersample k-space data simultaneously in a plurality of coils and reconstruct MR images with minimized artifacts from the obtained plurality of pieces of k-space data.

Known examples of parallel imaging techniques for time-series k-space data include techniques called k-space time Broad-use Linear Acquisition Speed-up Technique (k-t BLAST) and k-t sensitivity encoding (SENSE). The technique is called k-t BLAST when the number of coils is small relative to the proportion of reduced samples, and in other cases, called k-t SENSE. In the following description, however, k-t BLAST is also called k-t SENSE, unless explicitly specified. The following description mainly refers to the case of a plurality of coils. However, the case of a single coil is permitted as a special case of k-t BLAST. For the sake of convenience, the case of a single coil is also called k-t SENSE.

In comparison with k-t space, which is time-series k-space, the space in which Fourier transform is applied in the spatial and time direction is called x-f space, k-t SENSE is characterized in that parallel imaging technique is executed in x-f space. The sensitivity may be estimated from the data for reconstruction per se, or data for sensitivity estimation may be captured apart from data for reconstruction.

Figure 2:
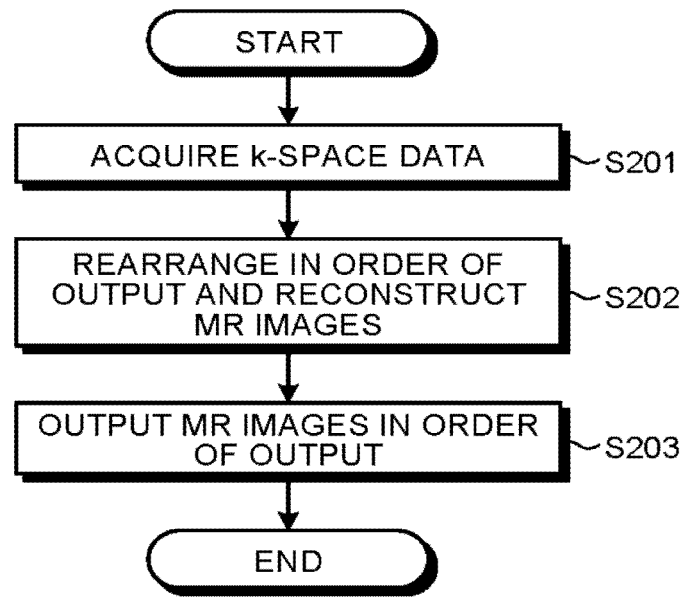
FIG. 2 is a flowchart illustrating the procedure of processing that may be performed by the MRI apparatus.

The processing illustrated in FIG. 2 may be performed when the MRI apparatus acquires time-series k-space data, performs a reconstruction process on the acquired time-series k-space data to generate MR images, and outputs the generated MR images. FIG. 2 is a flowchart illustrating the procedure of processing that may be performed by the MRI apparatus. As illustrated in the example in FIG. 2, the MRI apparatus acquires a plurality of pieces of k-space data (step S201). The MRI apparatus then rearranges the acquired k-space data from the order in which a plurality of pieces of k-space data are acquired (the order of acquisition) into the order of output, and performs a reconstruction process for reconstructing MR images on the rearranged k-space data (step S202). The MRI apparatus then outputs the reconstructed MR images in the order of output (step S203). The order of acquisition and the order of output may agree or may not agree. For example, in retrospective gating, after a plurality of pieces of k-space data are acquired, the acquired pieces of k-space data are rearranged in the order of output, and the reconstruction process for reconstructing MR images is performed on the rearranged k-space data. In any case, the order of a plurality of pieces of k-space data rearranged for performing a reconstruction process agrees with the order of output in which the corresponding MR images are output. The MR image corresponding to k-space data refers to the MR image generated by performing a reconstruction process on k-space data.

Now let us consider, for example, k-space data in which the signal intensity of the corresponding MR images gradually increases in the order of output. For example, such pieces of k-space data ace often obtained through imaging with administration of contrast medium or selective excitation. For example, when contrast medium is administered to a subject, the amount of contrast medium in a certain pare of the subject increases over time. The signal intensity of the MR images corresponding to k-space data obtained by imaging that part gradually thus increases over time.

Figure 3:
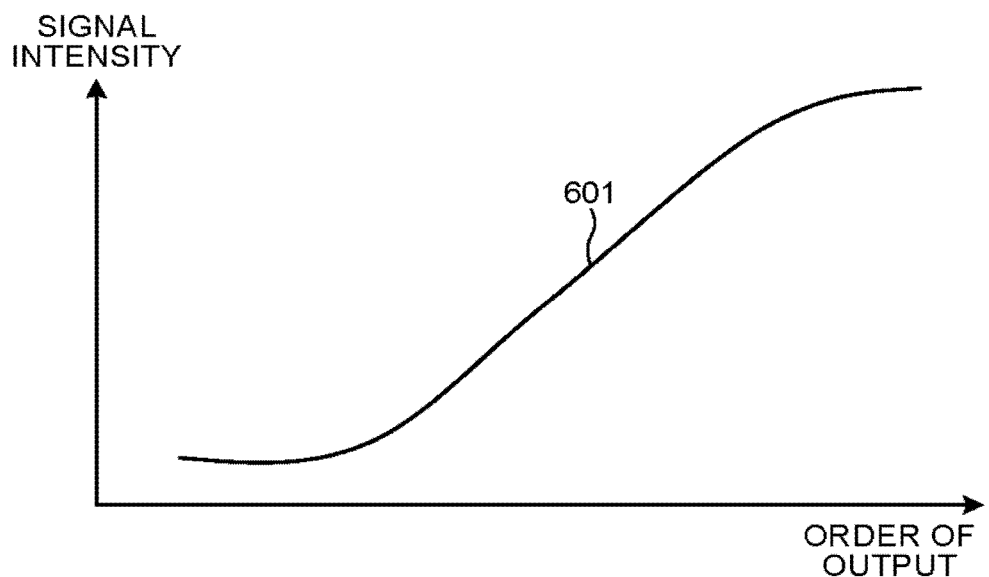
FIG. 3 is a diagram illustrating an example of the relation between the ordinal position of output and the signal intensity of MR images corresponding to a plurality of pieces of k-space data obtained by imaging a certain spatial position of a subject.

FIG. 3 is a diagram illustrating an example of the relation between the ordinal position of output and the signal intensity of MR images corresponding to a plurality of pieces of k-space data obtained by imaging a certain spatial position of a subject. In the example in FIG. 3, the horizontal axis represents the ordinal position of output, and the vertical axis represents the signal intensity. A graph 601 represents a function representing the relation between the ordinal position of output and the signal intensity of MR images. As illustrated by the graph 601, the signal intensity of the MR images increases as the ordinal position of output is later. For this reason, the difference in signal intensity is large between both ends of the graph 601 in the horizontal-axis direction.

Figure 4:
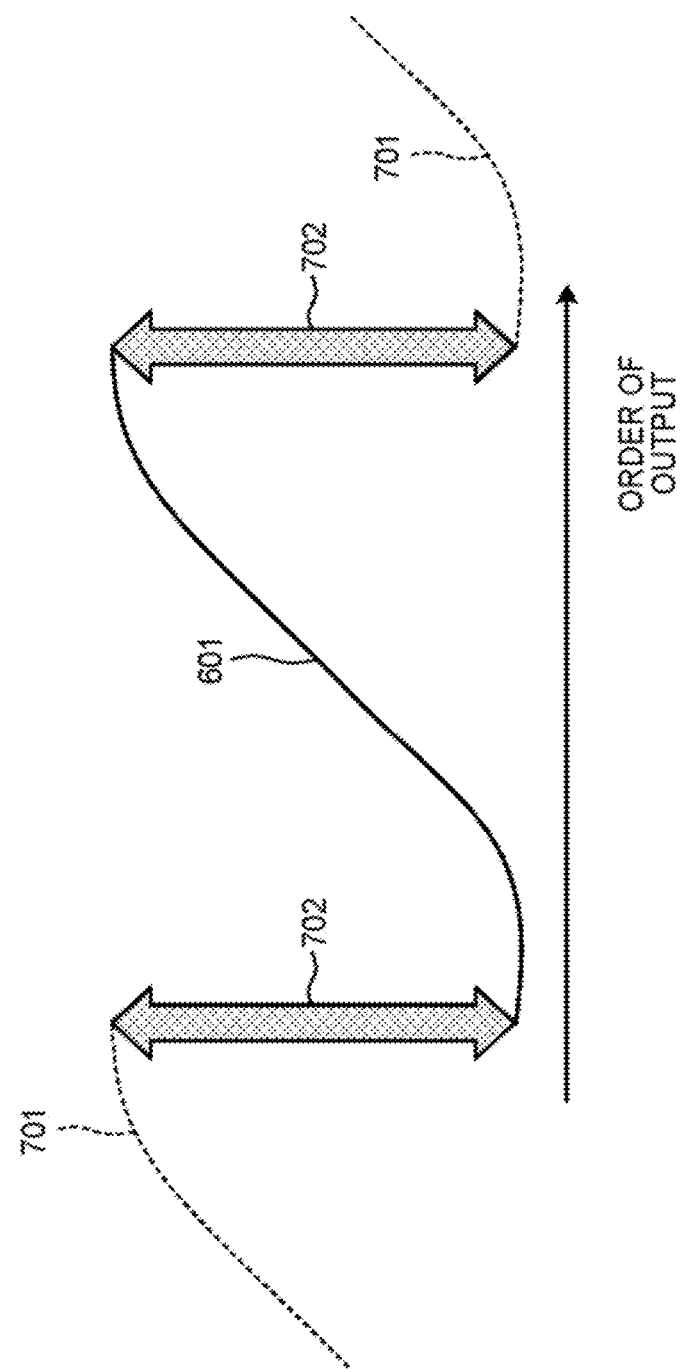
FIG. 4 is a diagram for explaining an example of transformation performed on the assumption that data to be transformed are periodically arranged.

FIG. 4 is a diagram for explaining an example of transformation performed on the assumption that data to be transformed are periodically arranged. In transformations such as Fourier transform, data to be transformed (target to be processed) are subjected to transformation on the assumption that the data to be transformed are periodically arranged. Here, data to be transformed are a plurality of pieces of k-space data, in the case where a plurality of pieces of k-space data are periodically arranged, the signal intensity of a plurality of MR images corresponding to a plurality of pieces of k-space data is illustrated in the example in FIG. 4, in which a graphs 701 having the same shape as the graph 601 are periodically present in the horizontal-axis direction. Since the difference in signal intensity between both ends of the graph 601 is large in the horizontal-axis direction, there is a large change of signal intensity at the connection between the graph 601 and the graph 701, and the difference 702 in signal intensity is large, as illustrated in the example in FIG. 4. When such a plurality of pieces of k-space data are transformed on the assumption that a plurality of pieces of k-space data are periodically arranged, and transformation back to the order of output is performed after some processing, artifacts unique to transformation may appear.

Now let us examine a function whose input value is the ordinal position of a plurality of pieces of k-space data to be transformed and whose output value is the signal intensity at a position of interest in an MR image obtained by reconstructing k-space data corresponding to the input value (referred to as the position-of-interest intensity transition function, for convenience of explanation). The signal intensity at the position of interest in an MR image hereinafter may be simply referred to as the signal intensity of an MR image. The position-of-interest intensity transition function represents, for example, the signal intensity of a plurality of MR images corresponding to a plurality of pieces of k-space data assumed to be periodically arranged. The more positions where the position-of-interest intensity transition function does not have continuity in MR images, the more noticeably the artifacts may occur. In the position-of-interest intensity transition function, when the input value is the ordinal position of k-space data on the assumption that a plurality of pieces of k-space data to be transformed are periodically arranged, there is a large change of signal intensity as illustrated in the example in FIG. 4, and therefore the position-of-interest intensity transition function does not have continuity. In this case, artifacts may occur. Whether the position-of-interest intensity transition function has continuity depends on the subject to be imaged and is difficult for the MRI apparatus to control. In other words, as long as the order of MR images generated by reconstruction agrees with the order of output, it is difficult to fundamentally minimize artifacts resulting from the lack of continuity in the position-of-interest intensity transition function. In reconstruction, the rearrangement of MR images into the order different from the order of output has not been introduced in the known arts.

Figure 5:
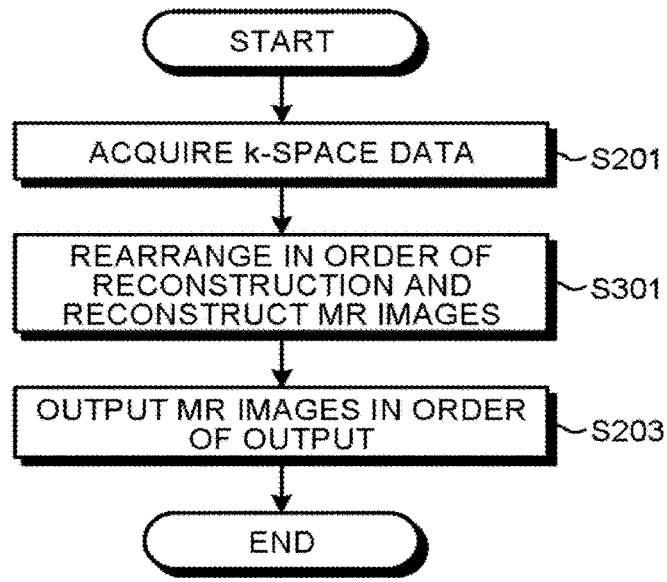
FIG. 5 is a diagram illustrating the procedure of processing performed by the MRI apparatus in the first embodiment.

In the first embodiment, in order to eliminate or minimize the occurrence of such artifacts, the new concept of the order of k-space data for performing reconstruction (the order of reconstruction), different from the order of output, is introduced. FIG. 5 is a diagram illustrating the procedure of processing performed by the MRI apparatus 100 in the first embodiment. For example, as illustrated in the example in FIG. 5, the MRI apparatus 100 acquires a plurality of pieces of k-space data (k-t space data) (S201). The MRI apparatus 100 then rearranges the acquired k-space data from the order of acquisition into the order of reconstruction and performs the process of reconstructing MR images on the rearranged k-space data to generate MR images (S301). The MRI apparatus 100 then outputs the generated MR images in accordance with the order of output, different from the order of reconstruction (step S203). As described above, in the first embodiment, the new concept of the order of reconstruction is introduced at S301, and the order of reconstruction is different from the order of output. The order of acquisition and the order of reconstruction may be the same or may be different without any limitation. For example, if the order of acquisition and the order of output are the same, the order of reconstruction is also different from the order of acquisition.

By removing the limitation that requires that the order of output and the order of reconstruction should agree, even if the function whose input value is the ordinal position of an MR image and whose output value is the signal intensity value at a position of interest in the MR image obtained by reconstructing k-space data corresponding to the input value does not have continuity in the case where a plurality of MB images arranged in the order of output are periodically arranged, the function whose input value is the order of an MR image and whose output value is the signal intensity value at a position of interest in the MR image corresponding to the input value has continuity in the case where MR images reconstructed in accordance with the order of reconstruction are periodically arranged, as will be described later. That is, even if the function representing the signal intensity of MR images does not have continuity in the case where a plurality of MR images arranged in the order of output are periodically arranged, the function representing the signal intensity of MR images has continuity in the case where the MR images reconstructed in accordance with the order of reconstruction are periodically arranged, as will be described later.

Figure 6:
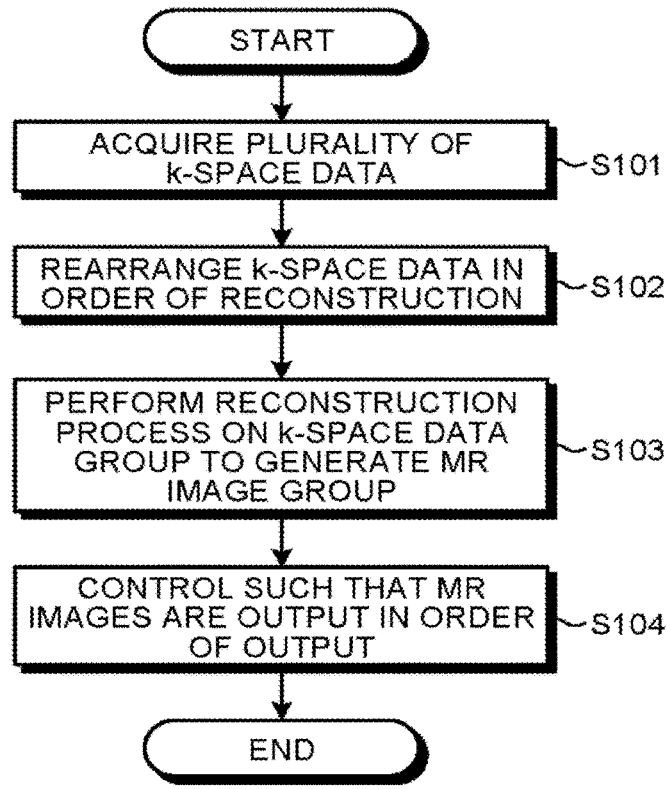
FIG. 6 is a flowchart illustrating an example of the procedure of processing performed by the MRI apparatus according to the first embodiment.

The processing functions including the acquisition function 123a, the rearrangement function 123b, the reconstruction function 123c, and the output control function 123d performed by the processing circuitry 123 illustrated in FIG. 1 will now be described. FIG. 6 is a flowchart illustrating an example of the procedure of processing performed by the MRI apparatus 100 according to the first embodiment.

As illustrated in the example in FIG. 6, the acquisition function 123a acquires a plurality of pieces of k-space data (step S101). The acquisition function 123a is an example of the acquisition unit recited in the claims. Step S101 is implemented by the processing circuitry 123 reading a computer program corresponding to the acquisition function 123a from the storage circuitry 122 and executing the read program.

For example, the acquisition function 123a generates sequence information based on the imaging conditions input from the operator through the input circuitry 124. The acquisition function 123a then transmits the generated sequence information to the sequence control circuitry 110 to control imaging. The acquisition function 123a then arranges time-series MR data sent from the sequence control circuitry 110 as a result of imaging into k-space to generate k-t space data, which is time-series k-space data. The acquisition function 123a then causes the generated k-t space data to be stored in the storage circuitry 122. The acquisition function 123a thus acquires a plurality of pieces of k-space data.

The rearrangement function 123b rearranges a plurality of pieces of k-space data acquired by the acquisition function 123a into the order of reconstruction different from the order in which the pieces of k-space data are acquired by the acquisition function 123a (the order of acquisition) (step S102). It is noted that the rearrangement function 123b rearranges a plurality of pieces of k-space data into the order of reconstruction, for each entire k-space. The rearrangement function 123b is an example of the rearrangement unit recited in the claims. The order of acquisition is an example of the first order recited in the claims, and the order of reconstruction is an example of the second order recited in the claims. Step S101 is implemented by the processing circuitry 123 reading a computer program corresponding to the rearrangement function 123b from the storage circuitry 122 and executing the read program.

Figure 7:
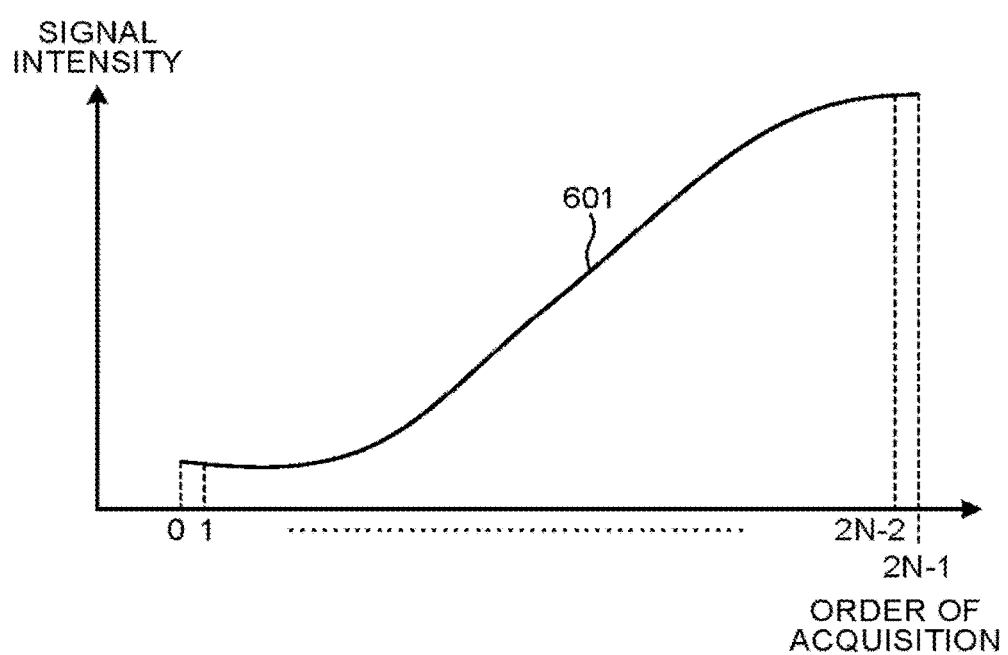
FIG. 7 is a diagram illustrating an example of the signal intensity of a plurality of MR images corresponding to a plurality of pieces of k-space data acquired by the acquisition function in the first embodiment.
Figure 8:
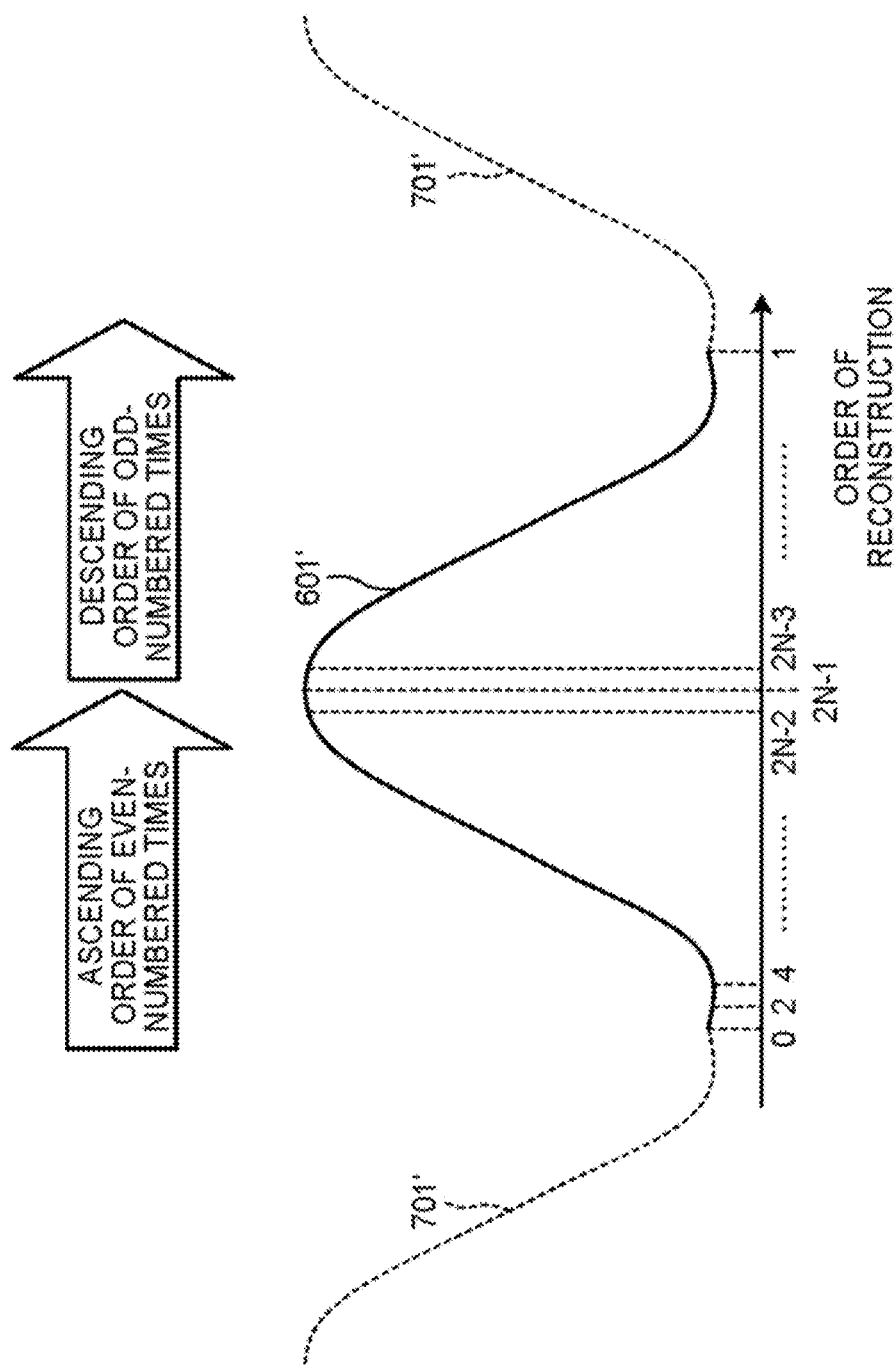
FIG. 8 is a diagram illustrating an example of the relation between the ordinal position of reconstruction of a plurality of MR images corresponding to a k-space data group rearranged by the rearrangement function in the first embodiment and the signal intensity of MR images generated in the ordinal position of reconstruction.

FIG. 7 is a diagram illustrating an example of the signal intensity of a plurality of MR images corresponding to a plurality of pieces of k-space data acquired by the acquisition function in the first embodiment. The graph 601 in FIG. 7 depicts a function representing the relation between the ordinal position or acquisition of a plurality of pieces of k-space data acquired by the acquisition function 123a and the signal intensity of MR images corresponding to the pieces of k-space data acquired in the ordinal position of acquisition. That is, in this function, the input value is the ordinal position of acquisition of a plurality of pieces of k-space data and the output value is the signal intensity of the MR image corresponding to the k-space data acquired with the input value. In the example in FIG. 7, the horizontal axis represents the ordinal position of acquisition, and the vertical axis represents the signal intensity. FIG. 8 is a diagram illustrating an example of the relation between the ordinal position of reconstruction of a plurality of MR images corresponding to the pieces of k-space data group rearranged by the rearrangement function in the first embodiment and the signal intensity of MR images generated in the ordinal position of reconstruction. In the example in FIG. 8, the horizontal axis represents the ordinal position of reconstruction, and the vertical axis represents the signal intensity. The graph 601' in FIG. 8 depicts the function representing the relation between the ordinal position of reconstruction of a plurality of MR images corresponding to the pieces of k-space data group rearranged by the rearrangement function 123b and the signal intensity of the MR images generated in the ordinal position of reconstruction. That is, in this function, the input value is the ordinal position of reconstruction of a plurality of MR images corresponding to the pieces of k-space data group rearranged by the rearrangement function 123b, and the output value is the signal intensity of the MR image reconstructed with the input value.

For example, the rearrangement function 123b performs the following processing, in the case where the signal intensity of a plurality of MR images corresponding to the acquired k-space data gradually increases as the MR image is acquired later, as illustrated by the graph 601 in FIG. 7, and when each sampling (acquisition) time is represented by a natural number of 0 to (2N−1). For example, as illustrated by the graph 601' in FIG. 8, the rearrangement function 123b first generates, as a k-space data group to be reconstructed, a k-space data group in which k-space data at even-numbered times 0, 2, 4, . . . , (2N−2) are arranged and thereafter k-space data at odd-numbered times 2N−1, 2N−3, . . . , 1 are arranged. That is, the rearrangement function 123b first generates, as a k-space data group to be reconstructed, a k-space data group in which k-space data at even-numbered times are arranged in ascending order and thereafter k-space data at odd-numbered times are arranged in descending order. In this manner, the rearrangement function 123b first assigns the ascending order of even-numbered times as the order of reconstruction and then assigns the descending order of odd-numbered times as the order of reconstruction. The rearrangement function 123b thus rearranges a plurality of pieces of k-space data acquired by the acquisition function 123a into the order of reconstruction to generate a k-space data group. This processing generates a k-space data group in which k-space data sampled at a sampling time 0 as the start of even-numbered times is the head (first) in the order of reconstruction and k-space data sampled at a sampling time 1 as the end of odd-numbered times is the trail (last) in the order of reconstruction. The example in FIG. 6 illustrates the signal intensity of MR images corresponding to a plurality of pieces of k-space data included in a k-apace data group in the case where k-space data groups to be reconstructed are periodically arranged. More specifically, as illustrated in the example in FIG. 8, the graphs 701' having the same shape as the graph 601' are periodically present in the horizontal-axis direction. As illustrated in the example in FIG. 8, the magnitude of change in signal intensity is reduced at the connection between the graph 601' and the graph 701', and the difference in signal intensity is reduced at the connection between the graph 601' and the graph 701'. With this, for example, the function depicted by the graph 601' and the graph 701' has continuity.

For example, assuming that a plurality of pieces of k-space data are periodically present in the example in FIG. 7, the difference in signal intensity at the connection between the graph 601' and the graph 701' is smaller than the difference in signal intensity at the connection between adjacent two graphs 601 in the case where the graphs 601 are periodically arranged. The rearrangement function 123b thus generates a k-space data group by rearranging a plurality of pieces of k-space data such that the difference in signal intensity at the connection between the graph 601' and the graph 701' is smaller than the difference in signal intensity at the connection between adjacent two graphs 601 in the case where a plurality of pieces of k-space data are periodically arranged. When a plurality of pieces of k-space data arranged in such order of reconstruction are subjected to a reconstruction process including Fourier transform by the reconstruction function 123c described later, artifacts are eliminated or minimized in an MR image generated by the reconstruction process.

In the example described above, the acquisition function 123a performs sampling at sampling times 0 to (2N−1), that is, sampling is performed an even number of times. However, the acquisition function 123a may perform sampling an odd number of times. The rearrangement function 123b may first allocate the descending order of odd-numbered times as the order of reconstruction and then allocate the ascending order of even-numbered times as the order of reconstruction. Alternatively the rearrangement function 123b may first allocate the descending order of even-numbered times as the order of reconstruction and then allocate the ascending order of odd-numbered times as the order of reconstruction. Alternatively the rearrangement function 123b may first allocate the ascending order of odd-numbered times as the order of reconstruction and then allocate the descending order of even-numbered times as the order of reconstruction. In the example described above, the times are classified into two groups, namely, odd numbers and even numbers. However, the rearrangement function 123b may classify the times into three or more groups, rather than two groups, and may allocate the times as the order of reconstruction.

We will now examine, for example, k-t SENSE where R (Reduction factor)=4. For the time t and the integer k equal to or greater than 0, with k-t SENSE, for example, the positions 4k+(t mod 4) are imaged in the phase encoding (ky) direction. For example, with k-t SENSE, k-space data obtained by imaging at the positions 4k+(t mod 4) in the phase encoding (ky) direction, that is, k-space data obtained by undersampling imaging are used in the Fourier transform performed in reconstruction of MR images.

Figure 9:
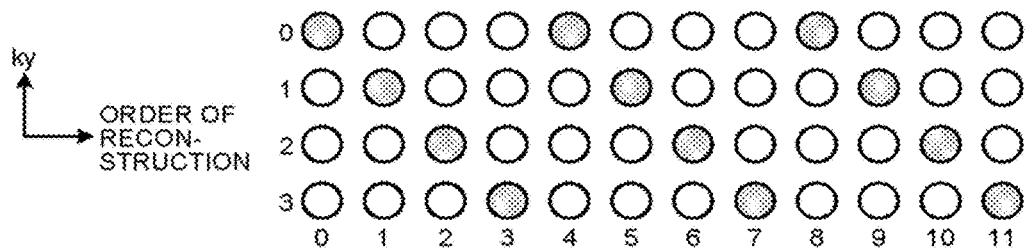
FIG. 9 is a diagram illustrating an example of the relation between the order of reconstruction in the reconstruction performed on k-space data and an imaging position (ky) in a phase encoding direction.
Figure 10:
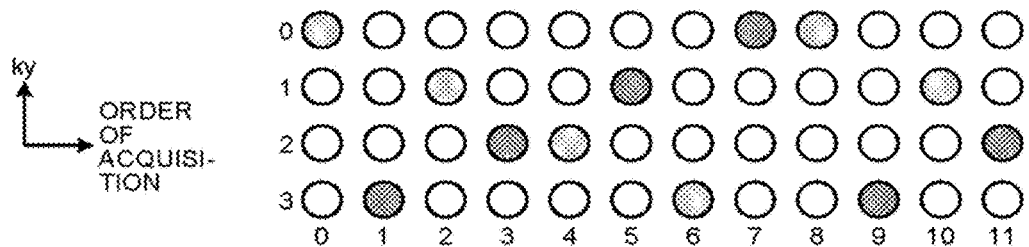
FIG. 10 is a diagram illustrating an example of the order of acquisition corresponding to the order of reconstruction in FIG. 9.

FIG. 9 is a diagram illustrating an example of the relation between the order of reconstruction in the reconstruction performed on k-space data and the imaging position (ky) in the phase encoding direction. FIG. 10 illustrates an example of the order of acquisition corresponding to the order of reconstruction in FIG. 9 using the technique of classification in the two, even-number and odd-number groups and allocation as described with reference to FIG. 7 and FIG. 8.

Figure 11:
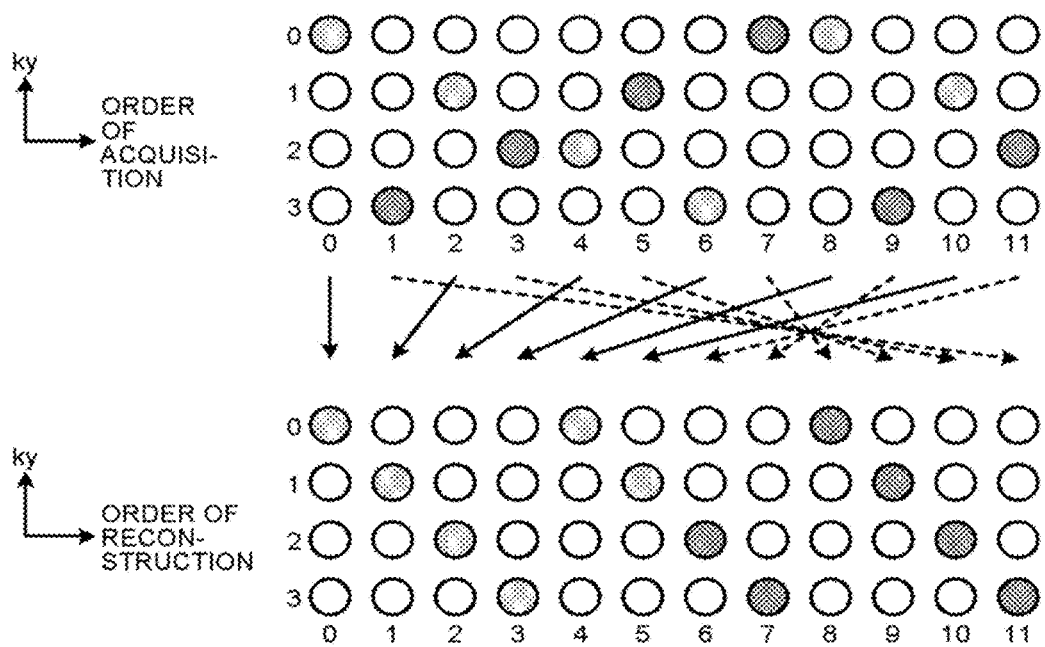
FIG. 11 is a diagram for explaining an example of rearrangement from the order of acquisition to the order of reconstruction.

FIG. 10 is a diagram illustrating an example of the order of acquisition corresponding to the order of reconstruction in FIG. 9. FIG. 11 is a diagram tor explaining an example of rearrangement from the order of acquisition to the order of reconstruction. In the example in FIG. 10, the acquisition function 123a acquires a plurality of pieces of k-space data such that the order of acquisition: 0, 1, 2, 3, . . . , 11, in total, 12, is put into ky mod 4: 0, 3, 1, 2, 2, 1, 3, 0, 0, 3, 1, 2. The rearrangement function 123b rearranges a plurality of pieces of k-space data acquired by the acquisition function 123a in this order of acquisition such that a plurality of pieces of k-space data corresponding to the order of acquisition 0, 2, 4, 6, 8, 10, 11, 9, 7, 5, 3, 1 are put into the order of reconstruction 0, 1, 2, . . . , 11, as illustrated in FIG. 11. A plurality of pieces of k-space data arranged in the order of reconstruction obtained as a result of rearrangement (data for reconstruction) are in the form represented by 4k+(s mod 4) where s is the ordinal position of reconstruction. The data for reconstruction obtained as a result of rearrangement by the rearrangement function 123b is data to which k-t SENSE is applicable. The rearrangement function 123b thus rearranges the pieces of k-space data acquired by the acquisition function 123a in the order of reconstruction so as to be adapted to the reconstruction process performed with k-t SENSE. The rearrangement function 123b thus can generate data for reconstruction adapted to the reconstruction process performed with k-t SENSE. That is, the acquisition function 123a described above acquires a plurality of pieces of k-space data such that the k-space data group including a plurality of pieces of k-space data rearranged by the rearrangement function 123b is adapted to the reconstruction process performed by the reconstruction function 123c described later. The acquisition function 123a also sets a pattern of undersampling acquisition such that the function representing the signal intensity of a plurality of MR images corresponding to a plurality of pieces of k-space data has continuity as a result the rearrangement by the rearrangement function 123b.

Returning to the description of FIG. 6, the reconstruction function 123c performs a reconstruction process including Fourier transform (for example, discrete Fourier transform) on the k-space data group including a plurality of pieces of k-space data rearranged by the rearrangement function 123b to generate an MR image group including a plurality of MR images (step 3103). For example, the reconstruction function 123c transforms the k-space data group rearranged by the rearrangement function 123b into x-f space data including image space and time spectrum by Fourier transform. The reconstruction function 123c then generates x-f space data with aliased signals being removed in the x-f space. The reconstruction function 123c then transforms the generated x-f space data into x-t spatial data by inverse Fourier transform to generate a plurality of time-series MR images. Here, Fourier transform is performed on the assumption that data to be transformed are periodically arranged. The reconstruction function 123c is an example of the reconstruction unit recited in the claims. Step S103 is implemented by the processing circuitry 123 reading a computer program corresponding to the reconstruction function 123c from the storage circuitry 122 and executing the read program.

As will be described below, the reconstruction function 123c derives sensitivity distribution (hereinafter referred to as sensitivity map) in time space. As used herein, the "time space" refers to the space in which pieces of time-series data are represented by coefficient values after transformation by transforming time-series data in the time direction. The transformation used here is any transformation that is reversible or considered to be approximately reversible and may be linear or non-linear. For example, when Fourier transform is used as the transformation, the time space is x-f space, which is the space in which unfolding processing is performed in k-t SENSE. The transformation is not limited to Fourier transform and may be, for example, wavelet transform.

When an unknown sensitivity map is derived, the reconstruction function 123c may specify a pixel with no signal in advance, so that the sensitivity value of the specified pixel can be set to "zero", thereby improving the performance. In this respect, a spatiotemporal sensitivity map in time space reflects the motion of an object in the time direction. The "spatiotemporal sensitivity map" is a collection of virtual sensitivity values (spatiotemporal sensitivity values) in time space of pixels for a certain channel. The reconstruction function 123c then specifies a pixel with no motion in time space in advance, using the property of being able to determine the presence or absence of motion of an object, and sets the sensitivity value of the specified pixel to "zero". For example, the reconstruction function 123c can determine the presence or absence of motion, that is, the presence or absence of sensitivity, with a signal value, because when the motion of an object is fast, its signals are distributed on the periphery in x-f space, whereas when the motion is slow, its signals are distributed at the center.

k-t Space and x-f Space

Figure 12:
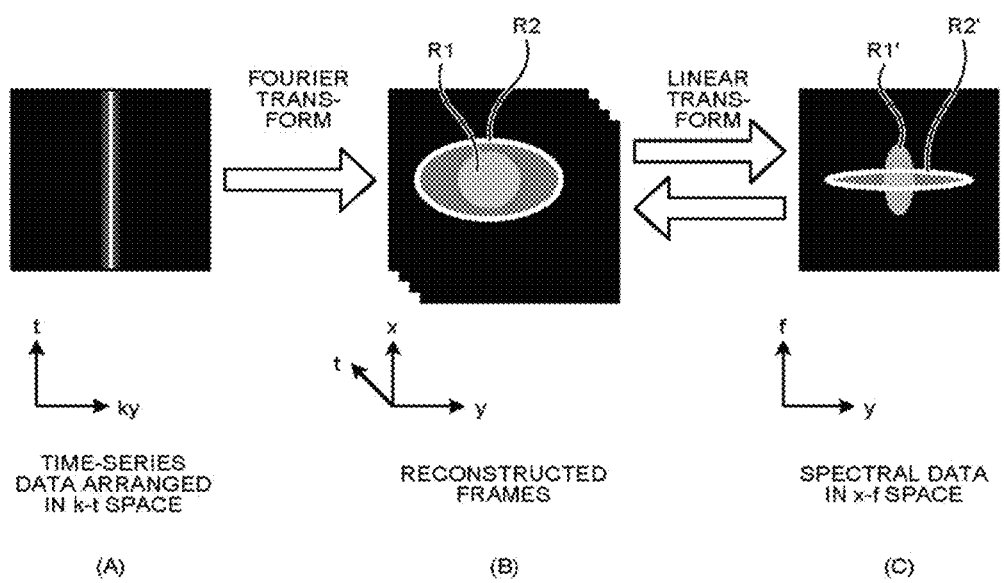
FIG. 12 is a diagram for explaining k-t space and x-f space in the first embodiment.

FIG. 12 is a diagram for explaining k-t space and x-f space in the first embodiment. In the first embodiment, pieces of time-series data are arranged at only some sampling positions of full sampling positions in k-space. First of all, k-t space and x-f space will now be described for full sampling positions.

The data on the left side in FIG. 12 represents time-series data arranged in k-t space. In the data on the left side in FIG.

12, the kx axis is omitted. The data at the center in FIG. 12 represents reconstructed frames obtained by reconstructing the time-series data arranged in k-t space by Fourier transform for each frame. The data on the right side in FIG. 12 represents spectral data in x-f space obtained by subjecting the time-series reconstructed frames to linear transformation, in which the time direction is considered to be an axis.

Here, in x-f space, the time direction is converted into time frequency. Pixels with fast motion have high time frequency and the signals are distributed on the periphery of x-f space. Pixels with slow motion have low time frequency and the signals ace distributed at the center of x-f space. The data at the center and the data on the right side in FIG. 12 schematically depict heart R1 (heart R1') and chest wall R2 (chest wall R2'). For example, as illustrated by the data on the right side in FIG. 12, for the heart R1' with motion, the signals are distributed over the periphery of x-f space, whereas for the chest wall R2' with no motion, the signals are distributed only at the center of x-f space. The transformation from the reconstructed frames is not limited to Fourier transform.

Figure 13:
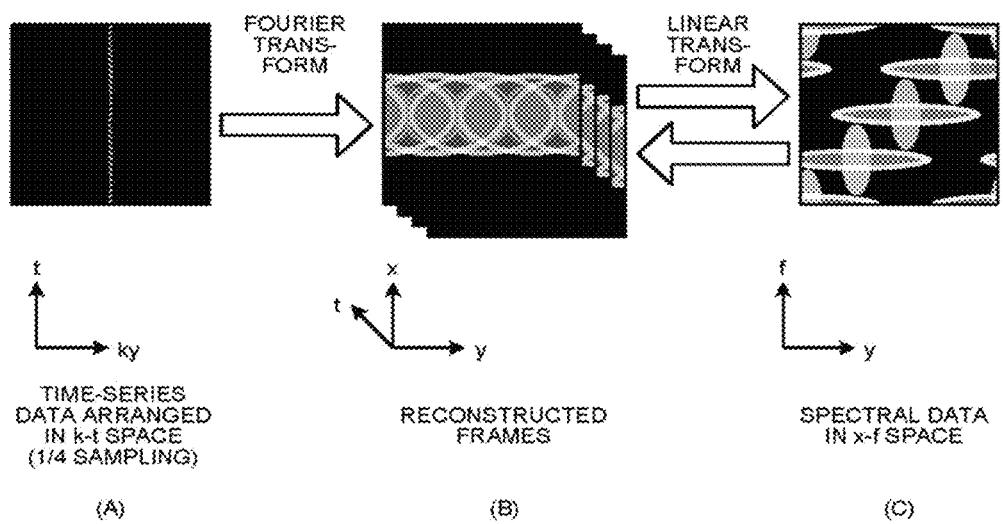
FIG. 13 is a diagram for explaining k-t space and x-f space in the first embodiment.

FIG. 13 is a diagram, similar to FIG. 12, for explaining k-t space and x-f space in the first embodiment. In this case, however, it is assumed that the acquisition function 123a in the first embodiment arranges data at some sampling positions, rather than full sampling. That is, the acquisition function 123a arranges data only at some sampling positions among the full sampling positions, with respect to at least one direction, in the space in which the apace in time direction (hereinafter referred to as time space) and the image space are integrated. It does not matter which direction includes positions where pieces of data are not arranged (where pieces of data are undersampled). The image space includes those in two dimensions and three dimensions. The directions of the image space include, for example, the phase encoding direction and the direction orthogonal thereto. For example, the data on the left side in FIG. 13 is time-series data arranged in k-t space with ¼ sampling in the phase encoding direction. The ¼ sampling refers to that three sampling positions are omitted out of four sampling positions and data is arranged at the one sampling position alone. In this case, as illustrated in FIG. 13, aliasing appears in the reconstructed frames. As illustrated in FIG. 13, this aliasing also appears in the spectral data in x-f space.

Figure 14:
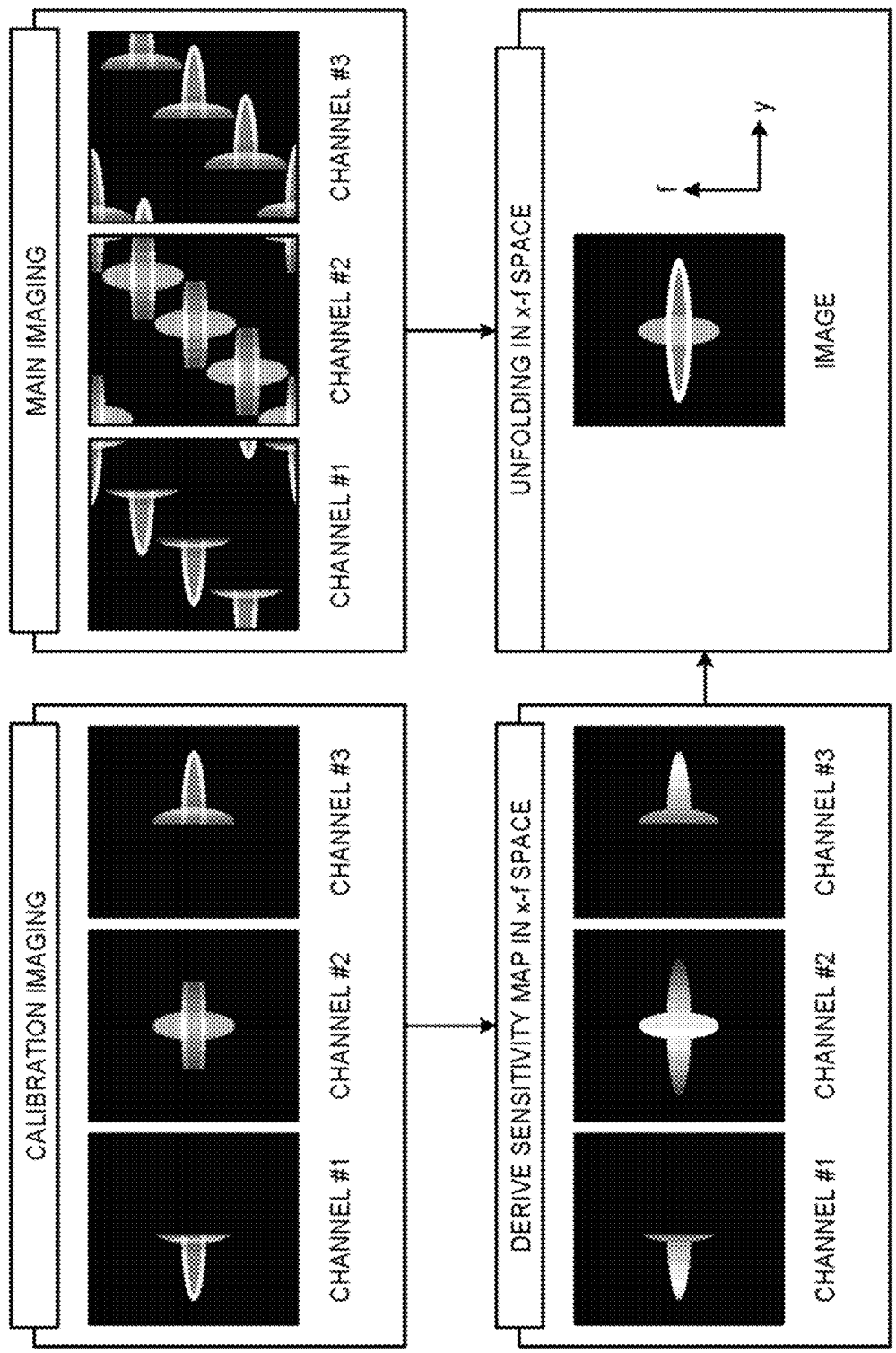
FIG. 14 is a diagram for explaining an example of the reconstruction process using k-t SENSE performed by the reconstruction function in the first embodiment.

FIG. 14 is a diagram for explaining an example of the reconstruction process using k-t SENSE performed by the reconstruction function 123c in the first embodiment. As described above, when pieces of data are arranged only at some sampling positions rather than full sampling, aliasing appears in the spectral data in x-f space. The reconstruction function 123c requires a sensitivity map in x-f space in order to unfold the aliasing in x-f space and generate an MR image free from aliasing. In order to do so, when generating an MR image using k-t SENSE, the reconstruction function 123c performs calibration imaging, apart from the main imaging for acquiring data for diagnostic images, and derives a sensitivity map in x-f space for each channel from the calibration data obtained for each channel, as illustrated in FIG. 14. The reconstruction function 123c then unfolds the aliasing in the spectral data in x-f space, using the spectral data in x-f space acquired for each channel in main imaging and the sensitivity map for each channel in x-f space. The reconstruction function 123c then transforms the spectral data in x-f space with aliasing unfolded, into data in x-t space by inverse Fourier transform to generate a plurality of MR images.

The reconstruction function 123c can reconstruct MR samples is small. However, k-t SENSE includes the process of transforming the t axis into the f axis using discrete Fourier transform in the time direction, separating the aliased signals on the f axis, and then transforming the f axis back to the t axis by inverse discrete Fourier transform in the time direction, since the discrete Fourier transform considers that both ends of data in the t axis direction are connected, a significant difference in signal intensity between two MR images corresponding to both ends of data in the t axis direction may lead to degradation in image quality of the reconstructed MR images. For example, artifacts that are not present originally in the acquired targets occur in the MR images as described above. In the first embodiment, therefore, the rearrangement function 123b rearranges the acquired k-space data into the order of reconstruction, and the reconstruction function 123c performs a reconstruction process on the rearranged k-space data group to generate an MR image group. This processing can eliminate or minimize unique artifacts that may be caused by Fourier transform.

Returning to the description of FIG. 6, the output control function 123d performs control such that a plurality of MR images in the MR image group generated by the reconstruction function 123c are output in the order of output, different from the order of reconstruction (step S104). The output control function 123d is an example of the output controller recited in the claims. The order of output is an example of the third order recited in the claims. Step S104 is implemented by the processing circuitry 123 reading a computer program corresponding to the output control function 123d from the storage circuitry 122 and executing the read program.

Figure 15:
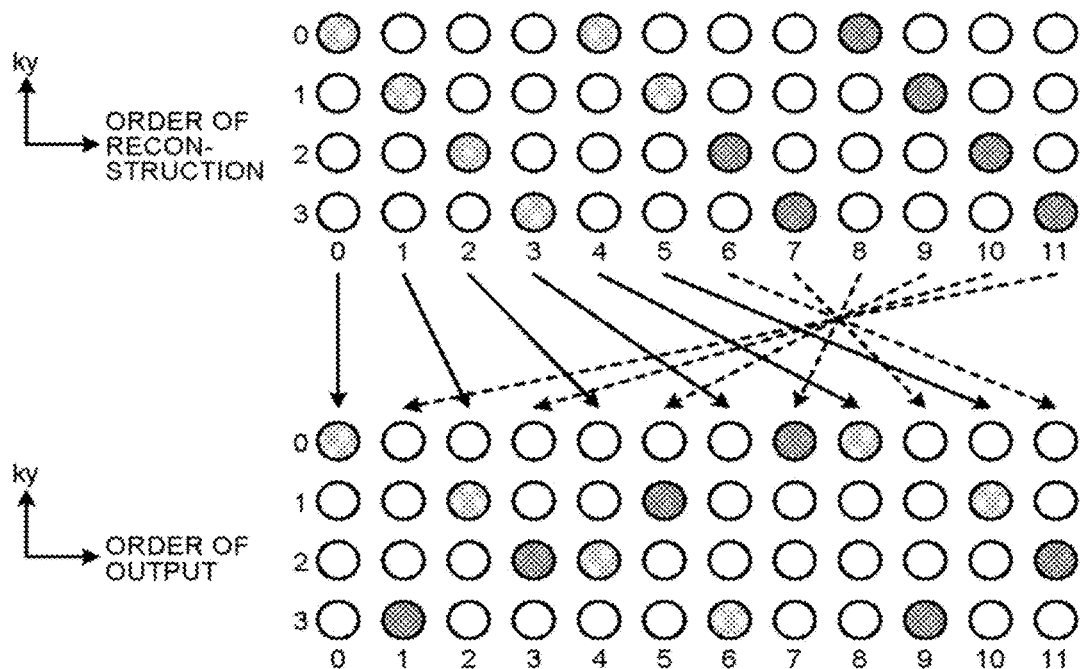
FIG. 15 is a diagram for explaining an example of rearrangement from the order of reconstruction to the order of output.

FIG. 15 is a diagram for explaining an example of rearrangement from the order of reconstruction to the order of output. For example, the output control function 123d rearranges a plurality of MR images generated by the reconstruction function 123c such that the MR images in the order of reconstruction: 0, 11, 1, 10, 2, 9, 3, 3, 4, 7, 5, 6 are put into the order of output: 0, 1, 2, . . . , 11, as illustrated in FIG. 15, and then causes the display 125 to display the MR images in the order of output. The MR images are thus output in the expected order of output.

The MRI apparatus 100 according to the first embodiment has been described above. The MRI apparatus 100 according to the first embodiment as described above can eliminate or minimize unique artifacts that may occur when the process of transformation such as Fourier transform is performed on the assumption that data to be transformed are periodically arranged.

In the foregoing first embodiment, k-t SENSE is used as an example of parallel imaging techniques. This k-t SENSE is a technique that transforms k-t space having k-space and time direction into x-f space including image space and time spectrum, performs the unfolding process (aliased signal separation) in x-f space, and then transforms the resultant x-f space data into time-series images. In this k-t SENSE, Fourier transform is used for transforming k-t space into x-f space, and inverse Fourier transform is used for transforming data in x-f space into time-series images. The MR image reconstruction is not limited to this technique. For example, in reconstruction of MR images, unique artifacts may occur in the reconstructed MR images, also with other MR image reconstruction techniques (for example, discrete cosine transform, Hadamard transform) in which transformation is performed for the t axis on the assumption that data to be transformed are periodically arranged, some processing is performed in the resulting space, and then inverse transformation of the transformation performed for the t axis is performed. These techniques thus may be used as the MR image reconstruction technique.

Examples other than k-t SENSE include sparse reconstruction techniques (for example, k-t SPARSE) using that x-f space data include many zeros. The MR image reconstruction technique in the first embodiment itself can be applied in either k-t SENSE or k-t SPARSE. Other examples of the MR image reconstruction technique include the techniques disclosed in Non-Patent Document (D. xu, K. F. King, Z. Liang, "Improving k-t SENSE by Adaptive Regularization," Magnetic Resonance in Medicine 57:916-930 (2007)) and Non-Patent Document (J. Tsao, P. Boeslger, K. P. Pruessmann, "k-t BLAST and k-t SENSE; Dynamic MRI With High Frame Rate Exploiting Spatiotemporal Correlations," Magnetic Resonance in Medicine 50:1031-1042 (2003)). Alternatively, the reconstruction technique using x-f space may be used as disclosed in Non-Patent Document (M. Lustig et al. k-t SPARSE: High Frame Rate Dynamic MRI Exploiting Spatio-temporal Sparsity. Proc. Intl. Soc. Mag. Reson. Med. 14: 2420 (2006)).

In the foregoing first embodiment, the data acquired by the acquisition function 123a are k-space data acquired in the order of acquisition, that is, k-t space data. However, the acquired pieces of data are not limited to such data. For example, the MRI apparatus 100 may acquire k-space data in a certain order.

Figure 16:
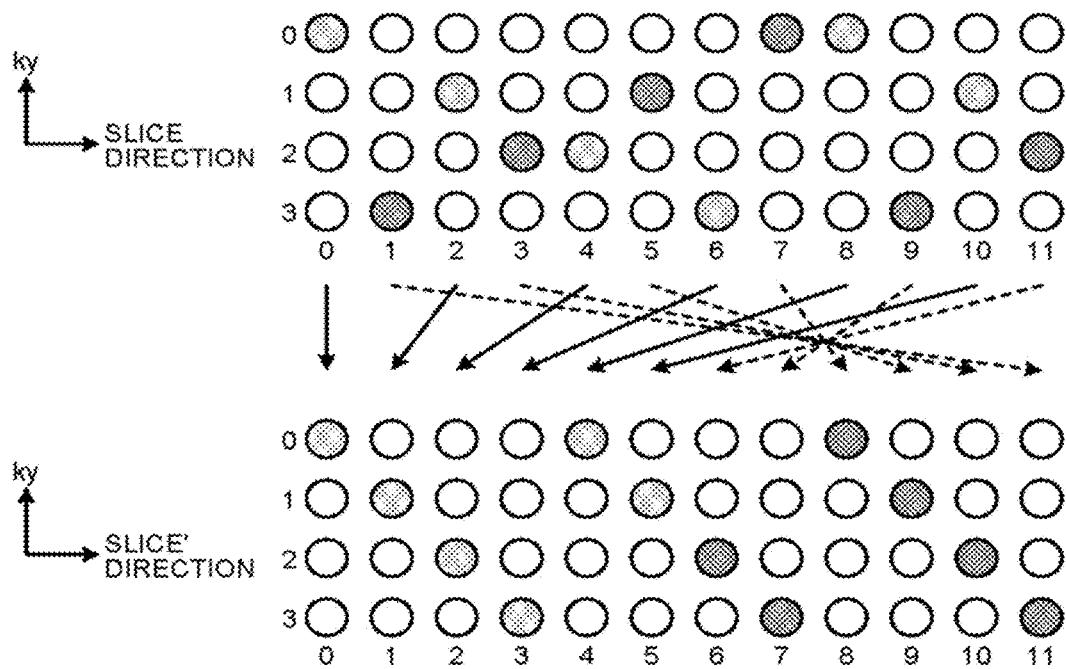
FIG. 16 is a diagram for explaining an example of acquisition and rearrangement of k-space data.

For example, the MRI apparatus 100 may acquire k-space data in the spatial order along the axis in the slice direction. The spatial order along the axis in the slice direction is an example of the first order recited in the claims. FIG. 16 is a diagram for explaining an example of acquisition and rearrangement of k-space data. In this case, as illustrated on the upper side of the FIG. 16, the acquisition function 123a of the MRI apparatus 100 acquires a plurality of pieces of k-space data in accordance with the spatial order along the axis in the slice direction. As illustrated in the lower side of FIG. 16, the rearrangement function 123b of the MRI apparatus 100 then rearranges the acquired k-space data into the order along the axis in the slice' direction that is the axis in reconstruction, such that the difference in signal intensity between two MR images corresponding to two k-space data on both ends is reduced, and that the function representing the signal intensity of a plurality of MR images corresponding to a plurality of pieces of k-space data assumed to be periodically arranged has continuity, in the same manner as in the first embodiment. For example, the order along the axis in the slice direction and the order along the axis in the slice' direction have one-to-one correspondence, and the rearrangement function 123b uses this correspondence to convert the order along the axis in the slice direction into the order along the axis in the slice' direction. In this case, the reconstruction function 123c reconstructs MR images using the MR image reconstruction technique called Controlled Aliasing In Parallel Imaging Results IN Higher Acceleration (CAIPI).

Figure 17:
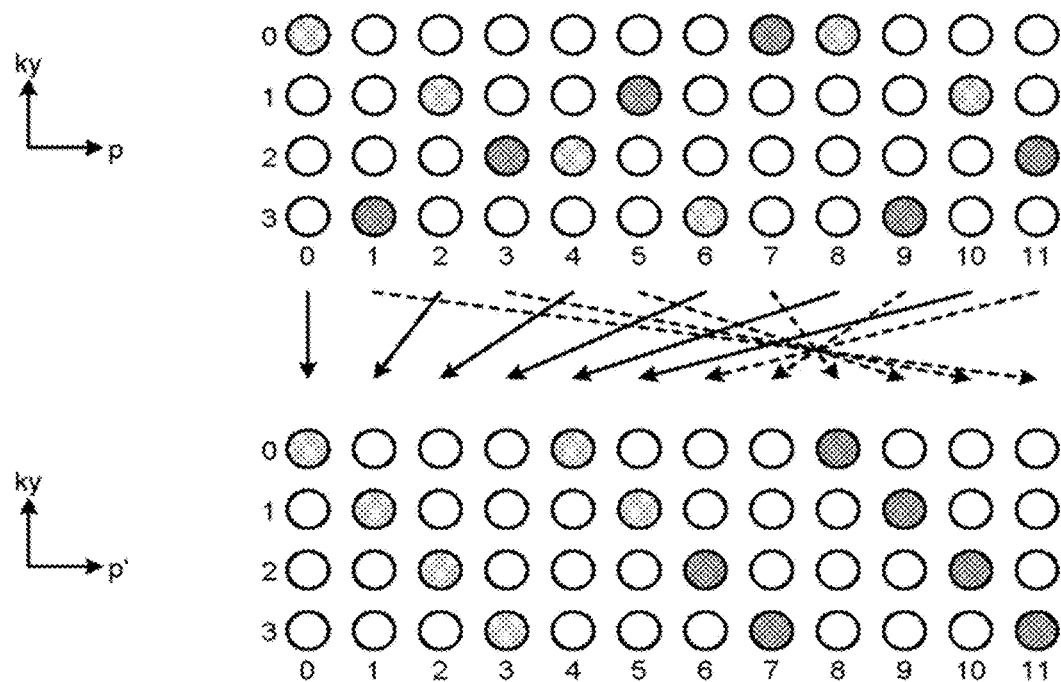
FIG. 17 is a diagram for explaining an example of acquisition and rearrangement of k-space data.

For example, the MRI apparatus 100 may acquire k-space data in the order along the axis of a parameter p, rather than the time t. As used heroin "p" refers to any given axis. FIG. 17 is a diagram for explaining an example of acquisition and rearrangement of k-space data. In this case, as illustrated in the upper side of FIG. 17, the acquisition function 123a acquires a plurality of pieces of k-space data in accordance with the order along the axis of p that is the axis in acquisition. As illustrated in the lower side of FIG. 17, the rearrangement function 123b then rearranges the acquired k-space data into the order along the axis of p' that is the axis in reconstruction, such that the difference in signal intensity between two MR images corresponding to two k-space data on both ends is reduced, and that the function representing the signal intensity of a plurality of MR images corresponding to a plurality of pieces of k-space data assumed to be periodically arranged has continuity, in the same manner as in the first embodiment. For example, the order along the axis of p and the order along the axis of p' have one-to-one correspondence, and the rearrangement function 123b uses this correspondence to convert the order along the axis of p into the order along the axis of p'. It is noted that p includes, for example, b value. The b value represents the strength of the motion probing gradient (MPG) pulse applied to a subject in capturing a diffusion-weighted image. In capturing a diffusion-weighted image, the MPG pulse is applied multiple times with different b values.

For example, when the difference in signal intensity between two MR images corresponding to two k-space data on both ends, among a plurality of pieces of k-space data acquired by the acquisition function 123a, is equal to or smaller than a predetermined value, the function representing the signal intensity of MR images corresponding to a plurality of pieces of k-space data assumed to be periodically arranged is thought to have continuity. In such a case, the rearrangement function 123b may not perform the rearrangement process, but the reconstruction function 123c may perform a reconstruction process on a plurality of pieces of k-space data acquired by the acquisition function 123a.

In the foregoing first embodiment, the rearrangement function 123b rearranges the acquired k-space data before the k-space data is subjected to the reconstruction process. However, the timing for rearranging a plurality of pieces of k-space data is not limited to this timing. For example, the rearrangement function 123b may rearrange the acquired k-space data while the reconstruction process is being performed. In this case, the rearrangement function 123b rearranges a plurality of pieces of k-space data, for example, before Fourier transform included in the reconstruction process is performed.

In the foregoing first embodiment, a plurality of pieces of k-space data acquired by the acquisition function 123a are rearranged by the rearrangement function 123b such that the function representing the signal intensity of MR images corresponding to a plurality of pieces of k-space data assumed to be periodically arranged has continuity. However, the acquisition function 123a may acquire a plurality of pieces of k-space data such that the function representing the signal intensity of the MR images corresponding to data assumed to be periodically arranged has continuity. In this case, the rearrangement function 123b may not perform the rearrangement process, but the reconstruction function 123c may perform the reconstruction process on a plurality of pieces of k-space data acquired by the acquisition function 123a. Such a modification will be described with reference to FIG. 18A to FIG. 18C.

Figure 18A:
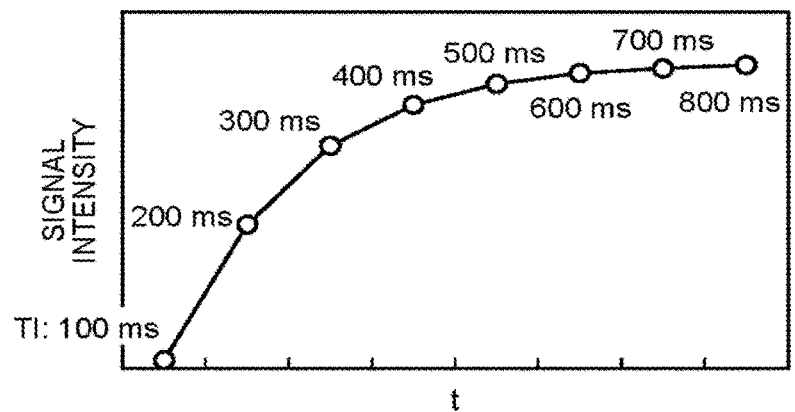
FIG. 18A is a diagram illustrating an example of the graph illustrating a function representing the relation between TI and the signal intensity of the MR image corresponding to k-space data acquired at each TI.

Ne will now describe, for example, a case where the MRI apparatus 100 acquires inversion time (TI) in an inversion recovery pulse sequence multiple times and acquires k-space data at any given timing in accordance with a sequence in which each TI can be set as desired. FIG. 18A is a diagram illustrating an example of the graph illustrating a function representing the relation between TI and the signal intensity of the MR image corresponding to k-space data acquired at each TI. In the example in FIG. 18A, the horizontal axis represents the time at which k-space data is acquired, and the vertical axis represents the signal intensity of the MR image corresponding to the acquired k-space data. In the example in FIG. 18A, TI is set in the order of 100 ms, 200 ms, 300 ms, 400 ms, 500 ms, 600 ms, 700 ms, 800 ms, and k-space data is acquired in the order of the set TI. As illustrated by the graph in the example in FIG. 18A, the larger the value of TI is, the greater the signal intensity is. The difference in signal intensity is thus large between two MR images corresponding to two k-space data on both ends in time of the acquired k-space data. That is, the difference is large between the signal intensity of the MR image corresponding to k-space data acquired at TI of 100 ms and the signal intensity of the MR image corresponding to k-space data acquired at TI of 800 ms. When the reconstruction function 123c performs the reconstruction process on a plurality of pieces of k-space data acquired in the order of TI as illustrated in the example in FIG. 18A, the above-described artifacts may occur in the MR images obtained as a result of the reconstruction process. The acquisition function 123a therefore may acquire a plurality of pieces of k-space data in the order of TI as described below.

Figure 18B:
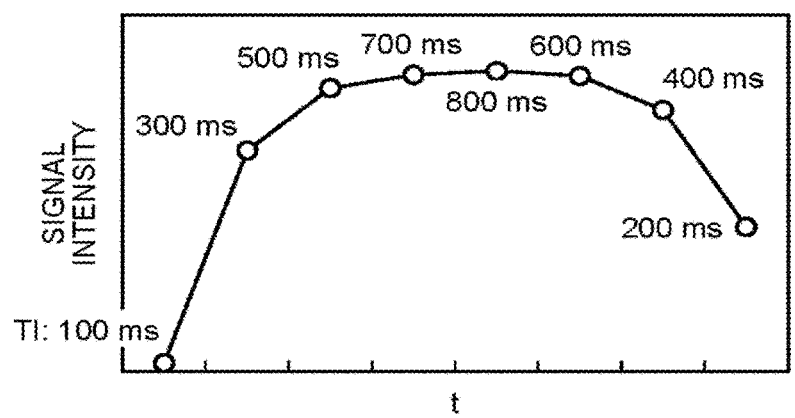
FIG. 18B is a diagram illustrating an example of the graph illustrating a function representing the relation between TI and the signal intensity of the MR image corresponding to k-space data acquired at each TI.

FIG. 18B is a diagram illustrating an example of the graph illustrating a function representing the relation between TI and the signal intensity of the MR image corresponding to k-space data acquired at each TI. In the example in FIG. 18B, the horizontal axis represents the time at which k-space data is acquired, and the vertical axis represents the signal intensity of the MR image corresponding to the acquired k-space data. In the example in FIG. 18B, TI is set in the order of 100 ms, 300 ms, 500 ms, 700 ms, 800 ms 600 ms, 400 ms, 200 ms. That is, the acquisition function 123a acquires k-space data in this order of TI. Therefore, the difference in signal intensity is small between two MR images corresponding to two k-space data on both ends in time of the acquired k-space data. That is, the difference is small between the signal intensity of the MR image corresponding to k-space data acquired at TI of 100 ms and the signal intensity of the MR image corresponding to k-space data acquired at TI of 200 ms. The reconstruction function 123c then performs the reconstruction process on a plurality of pieces of k-space data acquired in the order of TI as illustrated in the example in FIG. 18B to generate a plurality of MR images. As described above, artifacts can be eliminated or minimized because the difference in signal intensity is small between two MR images corresponding to two k-space data on both ends in time of the acquired k-space data.

Figure 18C:
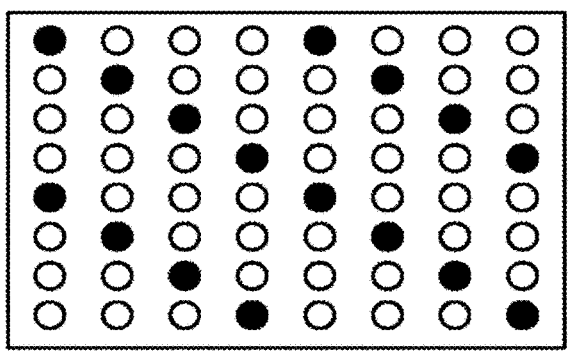
FIG. 18C is a diagram illustrating an example of sampling positions of k-space data acquired at TI illustrated in FIG. 18B.

FIG. 18C is a diagram illustrating an example of sampling positions of k-space data acquired at TI illustrated in FIG. 18B. As illustrated in the example in FIG. 18C, a sampling position is expressed as 4k+(s mod 4) where s is the ordinal position of acquisition and k is an integer equal to or greater than zero. A plurality of pieces of k-space data acquired by the acquisition function 123a are thus data to which k-t SENSE can be applied. The k-space data acquired by the acquisition Junction 123a are thus adapted to the reconstruction process performed with k-t SENSE. That is, the acquisition function 123a acquires a plurality of pieces of k-space data such that they are adapted to the reconstruction process performed by the reconstruction function 123c.

Alternatively, the rearrangement function 123b may rearrange the acquired k-space data by a method described below, based on the signal intensity of a plurality of MR images corresponding to the acquired k-space data, such that the function representing the signal intensity of the corresponding MR images on the assumption that the acquired pieces of k-space data are periodically arranged has continuity. That is, the rearrangement function 123b may rearrange a plurality of pieces of k-space data such that artifacts in the generated MR images are eliminated or minimized.

For example, the operator or the developer of the MRI apparatus 100 conducts an experiment of measuring the signal intensity of a plurality of MR images corresponding to a plurality of pieces of k-space data acquired by the acquisition function 123a, according to the subject body type and the sequence type. The operator or the developer then determines the order of reconstruction such that artifacts are eliminated or minimized in the generated MR images, according to the subject body type and sequence type, from the signal intensity corresponding to the subject body type and the sequence type that is obtained as a result of the experiment. The operator or the developer then causes the order of reconstruction associated with the subject body type and the sequence type to be stored in the storage circuitry 122 of the MRI apparatus 100.

When the acquisition function 123a acquires a plurality of pieces of k-space data, the rearrangement function 123b obtains subject information of the subject P being imaged (also referred to as patient information) that is stored in the storage circuitry 122. The rearrangement function 123b then obtains the order of reconstruction associated with the body type of the subject P indicated by the subject information and the sequence type indicated by the generated sequence information, from the storage circuitry 122. The rearrangement function 123b then rearranges the acquired k-space data into the order of reconstruction different from the order of acquisition. The rearrangement function 123b thus rearranges the acquired k-space data into the order of reconstruction different from the order of acquisition, based on the signal intensity of a plurality of MR images corresponding to the acquired k-space data.

Second Embodiment

Even when the MR image reconstruction method is a method that performs optimization using Fourier transform in the t direction and requires the original time order during optimization, the same processing as the processing performed by the rearrangement function 123b according to the foregoing first embodiment may be performed on the input of Fourier transform to apply the rearrangement in the time direction such that the function representing the signal intensity of MR images corresponding to a plurality of pieces of k-space data assumed to be periodically arranged has continuity. Such an embodiment will be described as a second embodiment.

FIG. 19 is a flowchart illustrating the procedure of processing performed by the MRI apparatus according to the second embodiment. One known example of the techniques using iterative optimization as optimization operation is to hold an intermediate reconstruction result in the inside and update the result. As illustrated in the example in FIG. 19, the MRI apparatus first sets an initial value of the intermediate reconstruction result (step S401). The MRI apparatus then performs the same processing as the processing performed by the rearrangement function 123b according to the foregoing first embodiment on the intermediate reconstruction result to perform time rearrangement in the time direction and perform time Fourier transform on the rearranged intermediate reconstruction result (step S402). That is, at step S402, the MRI apparatus rearranges the acquired k-space data from the order of acquisition into the order of reconstruction. This rearrangement can be expressed in the form of transformation matrix, and this transformation matrix can be used when optimization operation is derived from mathematical expressions.

The MRI apparatus then calculates the update amount using the transformation result at step S402 (step S403). At step S403, if the transformation result needs to be put back into the original order, the MRI apparatus performs the process of rearranging the order again on the intermediate reconstruction result. The MRI apparatus then updates the intermediate reconstruction result with the calculated update amount (step S404).

The MRI apparatus then determines whether a predetermined optimization termination condition is satisfied (step S406). Here, the optimization termination condition is for example, whether a predetermined number of iterations have been executed. If the optimization termination condition is satisfied (Yes at step S405), the MRI apparatus terminates the process. By contrast, if the optimization termination condition is not satisfied (No at step S405), the MRI apparatus returns to step S402.

If it is not necessary to put the order back into the original order during optimization, the MRI apparatus may rearrange the acquired k-space data from the order of acquisition into the order of reconstruction, before performing optimization, for example, before step S401.

The MRI apparatus according to the second embodiment has been described above. The MRI apparatus according to the second embodiment can eliminate or minimize unique artifacts, as in the first embodiment.

Image Processing Apparatus

In the foregoing embodiments, the MRI apparatus, which is a medical image diagnostic apparatus, performs the processing. Embodiments, however, are not limited to the MRI apparatus. For example, in place of the MRI apparatus, an image processing apparatus or an image processing system including an MRI apparatus and an image processing apparatus may perform the processing described above. As used herein, the image processing apparatus is, for example, a workstation an image storage device (image server) and a viewer in a picture archiving and communication system (PACS), an electronic health record system, or any other device. In this case, for example, the image processing apparatus receives k-space data acquired by the MRI apparatus from the MRI apparatus or from an image server via a network or accepts k-space data input from the operator through a recording medium, and causes the k-space data to be stored in a storage circuitry. The image processing apparatus then performs the processing described above (for example, the processing performed by the rearrangement function 123b, the reconstruction function 123c, and the output control function 123d) on the k-space data stored in the storage circuitry. In this case, the image processing apparatus has the functions corresponding to, for example, the acquisition function 123a, the rearrangement function 123b, the reconstruction function 123c, and the output control function 123d.

Image Reconstruction Program

The instructions illustrated in the process procedure in the foregoing embodiments can be executed based on a software program (which may also be referred to as image reconstruction program). A general-purpose calculator system may store therein this image reconstruction program in advance and read the image reconstruction program to achieve the same effects as the effects achieved by the MRI apparatus or the image processing apparatus in the foregoing embodiments. The instructions described in the foregoing embodiments are recorded in the form of a computer-executable image reconstruction program on a magnetic disk (for example, a flexible disk or a hard disk), an optical disk (for example a CD-ROM, a CD-R, a CD-RW, a DVD-ROM, a DVD±R, or a DVD±RW), a semiconductor memory, or any similar recording medium. The storage format of the storage medium may be any format readable by a computer or a built-in system. A computer can read the image reconstruction program from the recording medium and execute the instructions written in the image reconstruction program on the CPU based on the image reconstruction program to implement the same operation as in the MRI apparatus or the image processing apparatus in the foregoing embodiments. The computer may acquire or read the image reconstruction program via a network, as a matter of course.

For example, an operating system (OS) running on a computer, a database management system, or middleware (MW) for networks may execute part of the processing for implementing the foregoing embodiments, based on the instructions in the image reconstruction program installed in a computer or a built-in system from a recording medium.

The term "recording medium" is intended to include a medium independent of a computer or a built-in system as well as a recording medium that stores or temporarily stores therein the image reconstruction program transmitted and downloaded via a local area network (LAN), the Internet, or the like.

The term "recording medium" in the embodiments is intended to include a single recording medium as well as a plurality of recording media from which the processing in the foregoing embodiments is performed. The medium may have any configuration.

The computer or the built-in system is intended for executing each processing in the foregoing embodiments, based on the program stored in a recording medium, and may be a one-piece device such as a personal computer or a microcomputer, a system including a plurality of devices connected to a network, or any other configuration.

The term "computer" includes a personal computer as well as a processor or a microcomputer included in information processing equipment and collectively refers to equipment or apparatus capable of implementing the functions in the embodiments by programs.

The MRI apparatus, the image reconstruction method, and the image reconstruction program according to at least one of the foregoing embodiments can eliminate or minimize unique artifacts that may occur when the process of transformation is performed on the assumption that data to be transformed are periodically arranged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
processing circuitry configured to
acquire a k-space data group including a plurality of pieces of k-space data with undersampling in an axis of k-space and in an axis of time direction;
rearrange the plurality of pieces of k-space data into a second order different from a first order in which the plurality of pieces of k-space data are acquired;

perform a reconstruction process on the plurality of pieces of k-space data to generate an image group; and control a display to display a plurality of images in the image group, wherein the processing circuitry is further configured to rearrange the plurality of pieces of k-space data such that when the acquired k-space data group is periodically arranged, a function representing signal intensity of a plurality of images corresponding to a connection between two adjacent k-space data groups has continuity.

2. The magnetic resonance imaging apparatus according to claim 1, wherein the processing circuitry is further configured to perform control such that a plurality of images included in the generated image group are output in a third order different from the second order.

3. The magnetic resonance imaging apparatus according to claim 1, wherein the processing circuitry is further configured to rearrange the plurality of pieces of k-space data into the second order, based on signal intensity of a plurality of images corresponding to the plurality of pieces of k-space data.

4. The magnetic resonance imaging apparatus according to claim 2, wherein the processing circuitry is further configured to rearrange the plurality of pieces of k-space data such that a difference between a signal intensity of an image corresponding to first k-space data and a signal intensity of an image corresponding to last k-space data in the second order is smaller than a difference between a signal intensity of an image corresponding to first k-space data and a signal intensity of an image corresponding to last k-space data in the first order.

5. The magnetic resonance imaging apparatus according to claim 3, wherein the processing circuitry is further configured to rearrange the plurality of pieces of k-space data such that a difference between a signal intensity of an image corresponding to first k-space data and a signal intensity of an image corresponding to last k-space data in the second order is smaller than a difference between a signal intensity of an image corresponding to first k-space data and a signal intensity of an image corresponding to last k-space data in the first order.

6. The magnetic resonance imaging apparatus according to claim 1, wherein the processing circuitry is further configured to acquire the plurality of pieces of k-space data such that the rearranged k-space data group is adapted to the reconstruction process.

7. The magnetic resonance imaging apparatus according to claim 1, wherein the processing circuitry is further configured to generate a time-series image group by transforming the rearranged k-space data group into x-f space data including image space and time spectrum by Fourier transform, generate x-f space data with an aliased signal being removed in the x-f space data, and transform the generated x-f space data into an x-t space data group by inverse Fourier transform.

8. The magnetic resonance imaging apparatus according to claim 1, wherein the processing circuitry is further configured to acquire the plurality of pieces of k-space data in a slice direction.

9. The magnetic resonance imaging apparatus according to claim 1, wherein the processing circuitry is further configured to refer to a memory storing therein a plurality of orders, each of which corresponds to one of subject body types and one of sequence types, obtain, as the second order, one of the orders corresponding to a sequence type in acquisition of the plurality of pieces of k-space data and a subject body type from which the plurality of pieces of k-space data are acquired, and rearrange the plurality of pieces of k-space data into the obtained second order.

10. The magnetic resonance imaging apparatus according to claim 1, wherein the processing circuitry is further configured to perform the reconstruction process on the rearranged k-space data group to generate the image group, the reconstruction process including a process of transformation assuming that the rearranged k-space data group is periodically arranged.

11. The magnetic resonance imaging apparatus according to claim 2, wherein the processing circuitry is further configured to perform the reconstruction process on the rearranged k-space data group to generate the image group, the reconstruction process including a process of transformation assuming that the rearranged k-space data group is periodically arranged.

12. The magnetic resonance imaging apparatus according to claim 3, wherein the processing circuitry is further configured to perform the reconstruction process on the rearranged k-space data group to generate the image group, the reconstruction process including a process of transformation assuming that the rearranged k-space data group is periodically arranged.

13. A magnetic resonance imaging apparatus, comprising: processing circuitry configured to
acquire a k-space data group including a plurality of pieces of k-space data with undersampling in an axis of k-space and in an axis of time direction;
rearrange the plurality of pieces of k-space data into a second order different from a first order in which the plurality of pieces of k-space data are acquired;
perform a reconstruction process on the plurality of pieces of k-space data to generate an image group; and
control a display to display a plurality of images in the image group,
wherein the processing circuitry is further configured to set a pattern of undersampling acquisition such that when the acquired k-space data group is periodically arranged, a function representing signal intensity of a plurality of images corresponding to a connection between two adjacent k-space data groups has continuity.

14. The magnetic resonance imaging apparatus according to claim 13, wherein the processing circuitry is further configured to rearrange the plurality of pieces of k-space data such that a difference between a signal intensity of an image corresponding to first k-space data and a signal intensity of an image corresponding to last k-space data in the second order is smaller than a difference between a signal intensity of an image corresponding to first k-space data and a signal intensity of an image corresponding to last k-space data in the first order.

15. The magnetic resonance imaging apparatus according to claim 13, wherein the processing circuitry is further configured to perform the reconstruction process on the rearranged k-space data group to generate the image group, the reconstruction process including a process of transformation assuming that the rearranged k-space data group is periodically arranged.

16. A magnetic resonance imaging apparatus, comprising: processing circuitry configured to
acquire a plurality of pieces of k-space data with undersampling in at least one of axes of k-space and in a certain axis different from the axes of k-space;

rearrange the plurality of pieces of k-space data into a second order different from a first order in which the plurality of pieces of k-space data are acquired;

perform a reconstruction process on a rearranged k-space data group to generate an image group; and control a display to display a plurality of images in the image group, wherein the processing circuitry is further configured to rearrange the plurality of pieces of k-space data such that a difference between a signal intensity of an image corresponding to first k-space data and a signal intensity of an image corresponding to last k-space data in the second order is smaller than a difference between a signal intensity of an image corresponding to first k-space data and a signal intensity of an image corresponding to last k-space data in the first order.

17. A magnetic resonance image reconstruction method, comprising:

acquiring a k-space data group including a plurality of pieces of k-space data with undersampling in an axis of k-space and in an axis of time direction;

rearranging the plurality of pieces of k-space data into a second order different from a first order in which the plurality of pieces of k-space data are acquired;

performing a reconstruction process on the plurality of pieces of k-space data to generate an image group; and controlling a display to display a plurality of images in the image group, wherein the rearranging comprises rearranging the plurality of pieces of k-space data such that when the acquired k-space data group is periodically arranged, a function representing signal intensity of a plurality of images corresponding to a connection between two adjacent k-space data groups has continuity.

18. A magnetic resonance image reconstruction method, comprising:

acquiring a k-space data group including a plurality of pieces of k-space data with undersampling in an axis of k-space and in an axis of time direction;

rearranging the plurality of pieces of k-space data into a second order different from a first order in which the plurality of pieces of k-space data are acquired;

performing a reconstruction process on the plurality of pieces of k-space data to generate an image group; and controlling a display to display a plurality of images in the image group, wherein the acquiring comprises setting a pattern of undersampling acquisition such that when the acquired k-space data group is periodically arranged, a function representing signal intensity of a plurality of images corresponding to a connection between two adjacent k-space data groups has continuity.

19. A magnetic resonance image reconstruction method, comprising:

acquiring a plurality of pieces of k-space data with undersampling in at least one of axes of k-space and in a certain axis different from the axes of k-space;

rearranging the plurality of pieces of k-space data into a second order different from a first order in which the plurality of pieces of k-space data are acquired;

performing a reconstruction process on a rearranged k-space data group to generate an image group; and controlling a display to display a plurality of images in the image group, wherein the rearranging comprises rearranging the plurality of pieces of k-space data such that difference between signal intensity of an image corresponding to first k-space data and signal intensity of an image corresponding to last k-space data in the second order is smaller than difference between signal intensity of an image corresponding to first k-space data and signal intensity of an image corresponding to last k-space data in the first order.

* * * * *